US009634546B2

(12) United States Patent
Hanamura et al.

(10) Patent No.: US 9,634,546 B2
(45) Date of Patent: Apr. 25, 2017

(54) MULTI-SHAFT LINEAR MOTOR AND COMPONENT TRANSFER APPARATUS

(71) Applicant: YAMAHA HATSUDOKI KABUSHIKI KAISHA, Shizuoka-ken (JP)

(72) Inventors: Naoki Hanamura, Shizuoka-ken (JP); Kiyotaka Sakai, Shizuoka-ken (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 586 days.

(21) Appl. No.: 14/190,012

(22) Filed: Feb. 25, 2014

(65) Prior Publication Data

US 2014/0175910 A1 Jun. 26, 2014

Related U.S. Application Data

(62) Division of application No. 12/812,383, filed as application No. PCT/JP2009/050180 on Jan. 9, 2009, now Pat. No. 8,878,399.

(30) Foreign Application Priority Data

Jan. 11, 2008 (JP) .................................. 2008-004082

(51) Int. Cl.
*H02K 11/00* (2016.01)
*H02K 16/00* (2006.01)
(Continued)

(52) U.S. Cl.
CPC ......... *H02K 11/0005* (2013.01); *H02K 11/01* (2016.01); *H02K 11/21* (2016.01);
(Continued)

(58) Field of Classification Search
CPC .... H02K 11/0005; H02K 11/01; H02K 11/21; H02K 11/215; H02K 41/031; H02K 1/18; H02K 1/28
(Continued)

(56) References Cited

U.S. PATENT DOCUMENTS

| 6,426,573 B1 | 7/2002 | Hwang et al. |
| 6,608,407 B2 | 8/2003 | Kawada |

(Continued)

FOREIGN PATENT DOCUMENTS

| JP | 62-054583 U | 4/1987 |
| JP | 64-085562 A | 3/1989 |

(Continued)

OTHER PUBLICATIONS

Machine translation of JP6485562 (Mar. 1989).*
(Continued)

*Primary Examiner* — Michael Andrews
(74) *Attorney, Agent, or Firm* — Studebaker & Brackett PC

(57) ABSTRACT

A multi-shaft linear motor formed by a plurality of linear motors each provided with a magnetic body and an armature and adapted to produce a force causing the magnetic body and the armature to be relatively displaced along a given linear moving direction by interaction of magnetic fluxes generated between the magnetic body and the armature during an operation of supplying electric power to the armature. Each of the single-shaft linear motors includes a base plate. Base plate has a base surface defining the moving direction, wherein the stator is fixed onto the base surface along the moving direction, and the mover is attached onto the base surface in a movable manner reciprocating along the moving direction and in opposed relation to the stator. Single-shaft linear motors are stacked in a stacking direction (Continued)

perpendicular to the base surface such that the single-shaft linear motors are individually detachable as a unit.

6 Claims, 21 Drawing Sheets

(51) Int. Cl.

| | | |
|---|---|---|
| *H02K 41/03* | (2006.01) | |
| *H05K 13/04* | (2006.01) | |
| *H02K 11/01* | (2016.01) | |
| *H02K 11/21* | (2016.01) | |
| *H02K 11/215* | (2016.01) | |
| *B25J 15/06* | (2006.01) | |
| *H02K 5/04* | (2006.01) | |
| *H02K 1/18* | (2006.01) | |
| *H02K 1/28* | (2006.01) | |

(52) U.S. Cl.
CPC ........... *H02K 11/215* (2016.01); *H02K 16/00* (2013.01); *H02K 41/031* (2013.01); *H05K 13/0408* (2013.01); *B25J 15/06* (2013.01); *H02K 1/18* (2013.01); *H02K 1/28* (2013.01); *H02K 5/04* (2013.01); *H02K 2213/12* (2013.01)

(58) Field of Classification Search
USPC ......... 310/12.01, 12.04, 12.05, 12.06, 12.11, 310/12.13, 12.15, 12.33
See application file for complete search history.

(56) References Cited

U.S. PATENT DOCUMENTS

| | | |
|---|---|---|
| 8,350,419 B2 | 1/2013 | Hanamura et al. |
| 8,368,254 B2 | 2/2013 | Hanamura et al. |
| 8,368,259 B2 | 2/2013 | Sakai et al. |
| 2002/0047323 A1 | 4/2002 | Kawada |
| 2002/0178578 A1* | 12/2002 | Okamoto ........... H05K 13/0413 29/834 |
| 2004/0042890 A1 | 3/2004 | Hirata |
| 2005/0140213 A1 | 6/2005 | Miyamoto et al. |
| 2011/0025137 A1 | 2/2011 | Sakai |

FOREIGN PATENT DOCUMENTS

| | | | |
|---|---|---|---|
| JP | 6485562 | * 3/1989 | ............. H02K 41/03 |
| JP | 07-107728 A | 4/1995 | |
| JP | 11-043852 A | 2/1999 | |
| JP | 2001-275336 A | 10/2001 | |
| JP | 2002-171741 A | 6/2002 | |
| JP | 2002-307360 A | 10/2002 | |
| JP | 2003-219627 A | 7/2003 | |
| JP | 2006-180645 A | 7/2006 | |
| JP | 2006-190819 A | 7/2006 | |
| WO | 2006/068322 A1 | 6/2006 | |

OTHER PUBLICATIONS

International Search Report, PCT/JP2009/050180, Apr. 14, 2009.
Supplementary European Search Report, EP09700973, Dec. 19, 2011.
Japanese Office Action, JP2008-004082, Drafted Jan. 6, 2011.

* cited by examiner

MULTI-SHAFT LINEAR MOTOR AND COMPONENT TRANSFER APPARATUS

TECHNICAL FIELD

The present invention relates to a multi-shaft linear motor and a component transfer apparatus, and more particularly, to a multi-shaft linear motor formed by assembling a plurality of single-shaft linear motors each adapted to linearly move a movable section, and a component transfer apparatus using the multi-shaft linear motor.

BACKGROUND ART

A driving mechanism designed to drive in an upward-downward direction a suction nozzle for suction-holding a component is provided in, for example, component transfer apparatuses for handling components such as an electronic component, or manufacturing apparatuses for manufacturing a semiconductor device, a liquid-crystal display device, and others. A linear motor is employed as an element of such the driving mechanism. Demands for this type of linear motor have been increasing year by year. Particularly, there has been a growing need for a high-performance linear motor. To meet such a need, a linear motor, which is suitable for a component transfer apparatus, for example, has been proposed (see, for example, the following Patent Document 1).

Generally, a conventional linear motor has a cuboid housing with a wall thickness sufficient for mechanical strength. The housing contains a plurality of annular-shaped coils each having a hollow hole. These coils are arranged such that central axes of the hollow holes thereof align along a longitudinal direction of the housing to form a stator as a whole. Also, through-holes are formed in each of upper and lower walls of the housing to have a size slightly greater than that a diameter of a driving shaft so as to movably receive the driving shaft. Aligned coils as a stator are fixed to position hollow holes thereof to be concentric to each of the through-holes. The driving shaft as a mover, which is composed of a permanent magnet, is inserted into the through-holes and the hollow holes of the aligned coils to penetrate through the aligned coils concentrically.

Patent Document 1: JP 2006-180645A (FIGS. 5 and 8)

DISCLOSURE OF THE INVENTION

To obtain a high-performance, linear motor is required to adjust relative position (alignment) between a driving shaft (mover) and a coil (stator) with a high degree of accuracy. It is also required to improve not only ease of assemble but also maintenance serviceability.

However, the conventional technique described in the above prior art document requires an operation of adjusting positions of a large number of coils relative to a common housing, in advance of position adjustment between a driving shaft and aligned coils. Specifically, it is necessary to form a plurality pairs of upper and lower through-holes in upper and lower wall members of a housing with a high-degree of positional accuracy. Also, an aligned coils inside the housing should be arranged in such a manner that relative positions between each coil and a corresponding one of the upper and lower through-holes pair of the housing are maintained with a high-degree of positional accuracy so that the aligned coils are aligned with the corresponding pair of the upper and lower through-holes in an upward-downward direction. Furthermore, it is necessary to insert the driving shafts into the respective upper and lower through-holes pair and the hollow hole of the aligned coils, while maintaining the positioning of the driving shaft relative to the housing. As stated above, the conventional technique requires an assembling operation of the aligned coils and the driving shafts into the linear motor while maintaining the positioning of them relative to the common housing. Such an assembling operation of the driving shafts maintaining relative positioning accuracy is anything but easy, and thereby it is difficult to produce a high-performance multi-shaft linear motor.

It is a primary object of the present invention to provide a high-performance linear motor which is excellent in ease of assemble and maintenance serviceability.

It is another object of the present invention to provide a component transfer apparatus using the above linear motor.

In order to solve above problem, according to one aspect of the present invention, there is provided a multi-shaft linear motor which comprises a plurality of single-shaft linear motors each provided with a magnetic body and an armature, and the single-shaft linear motor is adapted to produce a force which causes the magnetic body and the armature to be relatively displaced along a given linear moving direction by interaction of magnetic fluxes generated between the magnetic body and the armature during an operation of supplying electric power to the armature. The single-shaft linear motor includes: a stator formed as one of the magnetic body and the armature; a mover formed as the other of the magnetic body and the armature and adapted to be movable relative to the stator; and a base plate having a base surface defining the moving direction. The stator is fixed onto the base surface along the moving direction, and the mover is attached onto the base surface in a movable manner reciprocating along the moving direction and in opposed relation to the stator. Also, the single-shaft linear motors are stacked in a stacking direction perpendicular to the base surface in such a way that the single-shaft linear motors are individually detachable as a unit. Each the base plate of the units contains the stator and the mover.

In this aspect, each of the single-shaft linear motors in which the stator and the mover formed as one and the other of the magnetic body and the armature are provided on the base plate can be handled as a separate unit, so that it is not necessary to disassemble the stator and the mover during assembling or maintenance of the multi-shaft linear motor. Thus, it becomes possible to guarantee relative positioning accuracy of each of the movable sections of the multi-shaft linear motor based on assembling accuracy of each of the single-shaft linear motors.

Also, in the present invention, the multi-shaft linear motor is formed by arranging the plurality of single-shaft linear motors in a stacking manner. Thus, the number of the movable sections in the multi-shaft linear motor can be easily changed by changing the number of the single-shaft linear motors to be stacked, so that the multi-shaft linear motor is excellent in versatility. In addition, a maintenance operation, such as inspection or repair, can be performed with respect to each of the single-shaft linear motors constituting the multi-shaft linear motor, so that the multi-shaft linear motor is also excellent in terms of maintenance serviceability.

According to another aspect of the present invention, there is provided a component transfer apparatus having the above the multi-shaft linear motor as an upward/downward driving mechanism.

These and other features and advantages of the present invention will become more apparent from embodiments thereof which will be described with reference to the accompanying drawings.

BEST MODE FOR CARRYING OUT THE INVENTION

With reference to the drawings, the best mode for carrying out the present invention will now be specifically described.

The present invention relates to a multi-shaft linear motor MLM formed by assembling a plurality of single-shaft linear motors LM each adapted to linearly move a movable section with respect to a base plate, and a component transfer apparatus using the multi-shaft linear motor MLM. In the following description, after describing a single-shaft linear motor LM suited to constitute a multi-shaft linear motor MLM according to the present invention, it will be separately described in detail with respect to a multi-shaft linear motor MLM according to the present invention and a surface mounter MT which is one example of a component transfer apparatus using the multi-shaft linear motor MLM. To clarify a directional relationship in each of the following illustrative figures, XYZ rectangular coordinate axes on the basis of a linear motor LM and MLM are shown therein. Among the three directions X, Y, and Z, a moving direction to be set for the linear motor LM and MLM, a widthwise direction of the linear motor LM and MLM, and a frontward-rearward direction of the linear motor LM and MLM, are indicated by Z, Y, and X, respectively. Also, the signs (+, −) in each of the rectangular coordinate axes designate a frontward side (+X side), a rearward side (−X side), one edge side (−Y side), the other edge side (+Y side), a forward side (−Z side) and a backward side (+Z side), in the directions X, Y, AND Z, for descriptive purposes.

<Single-Shaft Linear Motor Preferable for Multi-Shaft Linear Motor>

Figure 3:
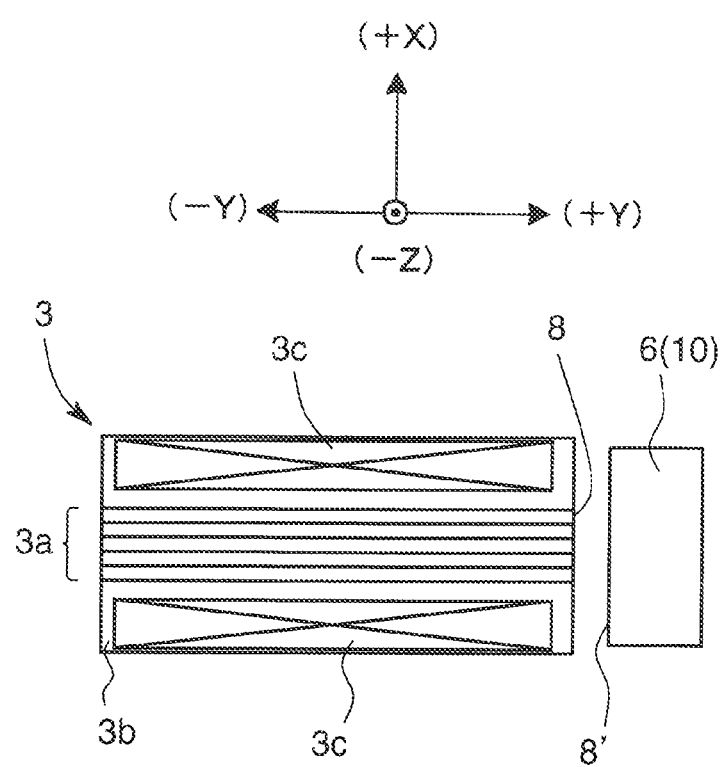
FIG. 3 is a diagram showing an arrangement relationship between an armature and a mover in the mode of implementation illustrated in FIG. 1.
Figure 4:
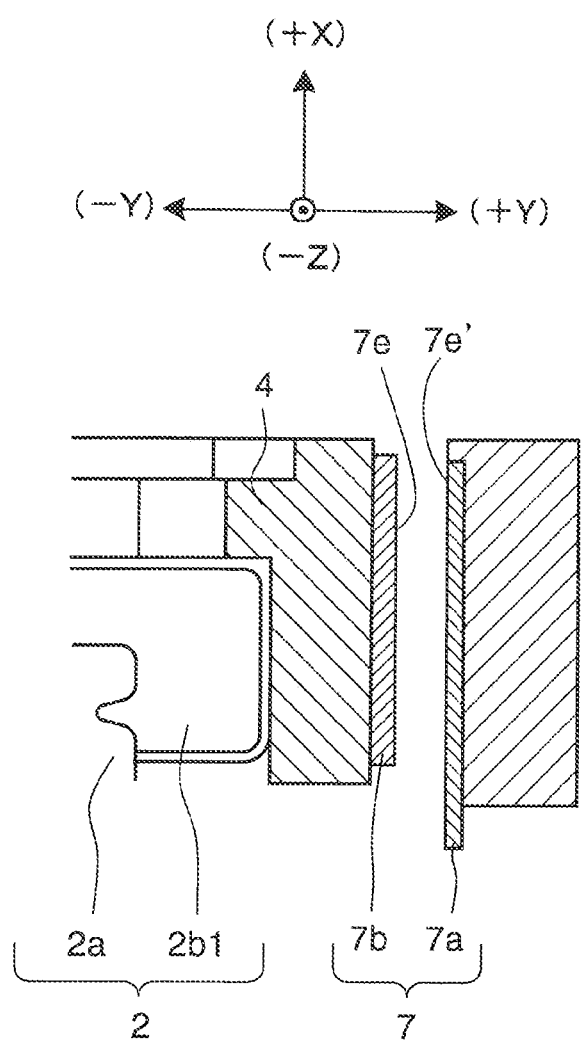
FIG. 4 is a diagram showing an arrangement relationship between a linear scale and a sensor in the mode of implementation illustrated in FIG. 1.
Figure 5:
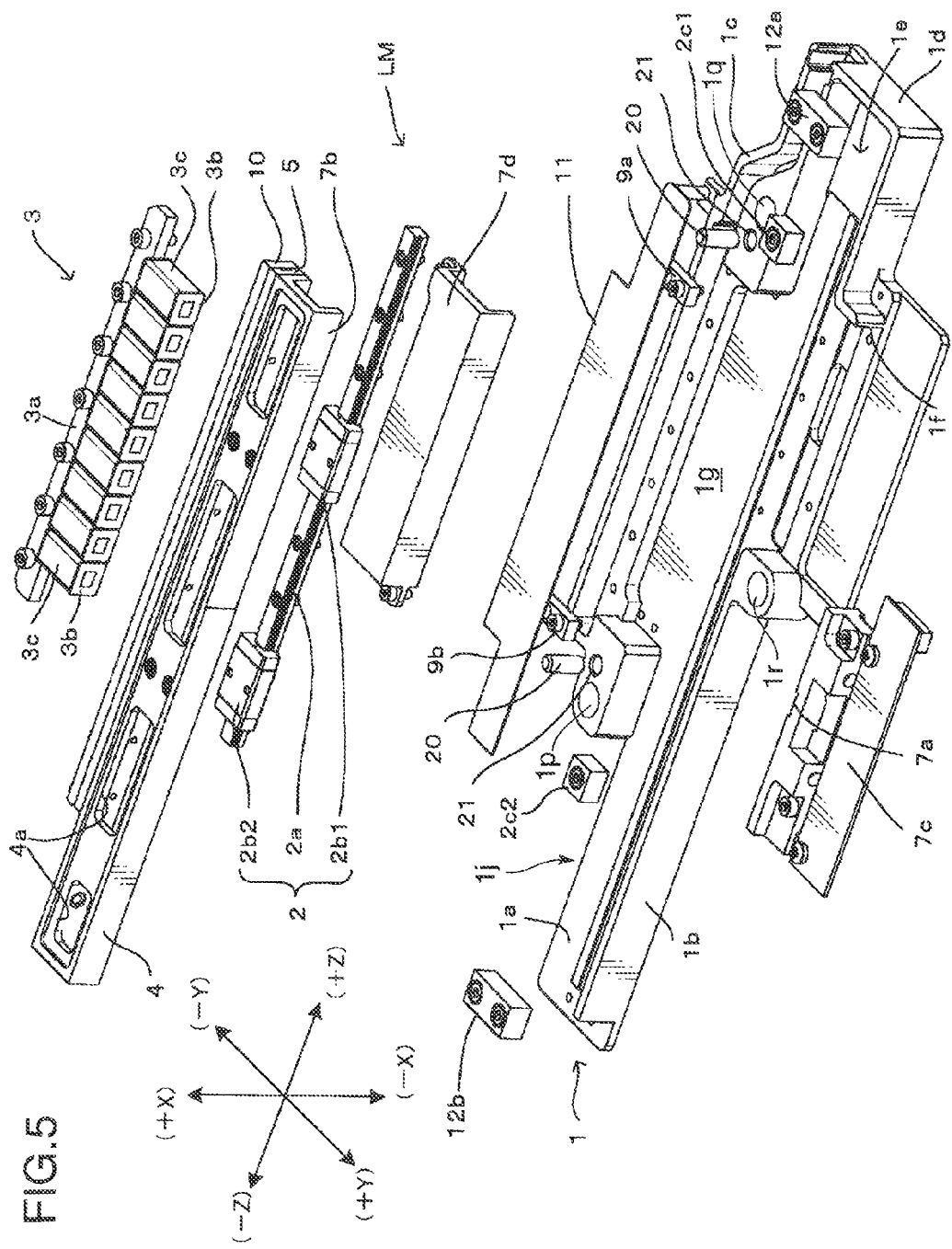
FIG. 5 is an exploded perspective view of the single-shaft linear motor in the mode of implementation illustrated in FIG. 1.

Referring to FIGS. 1 to 5, this single-shaft linear motor LM has a thin tray-shaped base plate 1. The base plate 1 is designed such that a longitudinal direction thereof defines a given moving direction Z. As shown in FIG. 5, an inner bottom surface of the base plate 1 is formed as a base surface 1a, and three standing walls 1b to 1d each standing toward the frontward side (+X side) are continuously provided along two edges of the base plate 1 on respective opposite sides (+Y and −Y sides) in the widthwise direction Y and one edge of the base plate 1 on the backward side (+Z side) in the moving direction Z, wherein the standing walls 1b to 1d and the base surface 1a make up a bottomed recess portion 1e opened toward the frontward side (+X side). The recess portion 1e is one example of a containing space for containing therein elements of the single-shaft linear motor LM in an after-mentioned manner. Numeral 1h in FIGS. 1 and 2 designates a spring engagement portion for allowing one of opposite ends of a return spring 15 (see FIG. 20) for biasing a movable base 4 toward the backward side (+Z side) to be attached thereto, as described later. In this mode of implementation, the base surface 1a and the standing walls 1b to 1d are integrally molded using an aluminum alloy or the like to form the base plate 1 as a non-magnetic member. Alternatively, the base plate 1 may be formed by producing the base surface 1a and the standing walls 1b to 1d separately and then assembling these components together. Although the base plate 1 is made of such a non-magnetic material, it is understood that the base plate 1 may be made of a resin material.

As mentioned above, in the single-shaft linear motor LM, the frontward-rearward direction X corresponds to a direction perpendicular to the base surface 1a. A space or the recess portion 1e, which are surrounded by standing walls 1b to 1d extending along the frontward direction and the base surface 1a, corresponds to a "containing space" in the appended claims. In this mode of implementation, a forward-side (−Z side) of the base plate 1 in the moving direction Z is open so that the standing walls 1b to 1d define an open zone 1j communicating between the internal space (containing space) of the recess portion 1e and an outside of the internal space. In this mode of implementation, the formation of the open zone 1*j* allows an after-mentioned movable base 4 and an after-mentioned block member 164 to be partly moved in and out of the internal space of the recess portion 1*e* according to driving of the after-mentioned movable base in the moving direction Z.

A linear guide 2 is provided on the base surface 1*a* to extend along the moving direction Z. The linear guide 2 comprises a linear-shaped rail 2*a* fixed to the base plate 1 along the moving direction Z, and two sliders 2*b*1 and 2*b*2 each attached to the rail 2*a* slidably only in the moving direction Z. Also, in order to prevent the sliders 2*b*1 and 2*b*2 from leaving the rail 2*a*, two linear guide stoppers 2*c*1 and 2*c*2 are attached to the base surface 1*a* of the base plate 1 at positions opposed to respective opposite longitudinal ends of the linear guide 2.

A movable base 4 is attached to the sliders 2*b*1 and 2*b*2 to extend along the moving direction Z. The movable base 4 has an internal space having a reverse U shape in transverse section (section taken along an X-Y plane). The movable base 4 is fixed to the sliders 2*b*1 and 2*b*2 so that a ceiling surface of the internal space seat on respective upper surfaces of the sliders 2*b*1 and 2*b*2. In this single-shaft linear motor LM, a plurality of through-holes 4*a* are formed in the ceiling surface of the movable base 4 to facilitate a reduction in weight of the movable base 4. As mentioned above, in the single-shaft linear motor LM, the movable base 4 and the sliders 2*b*1 and 2*b*2 are adapted to be integrally movable in the moving direction Z, to serve as a component equivalent to a "movable section" in the appended claims. As described later, the movable base 4 is provided with a mover which is attached to a lateral surface of an end of the movable base 4 on the one edge side (-Y side) in the widthwise direction Y, and a linear scale 7*b* which is attached to a lateral surface of an end of the movable base 4 on the other edge side (+Y side) in the widthwise direction Y.

Figure 6:
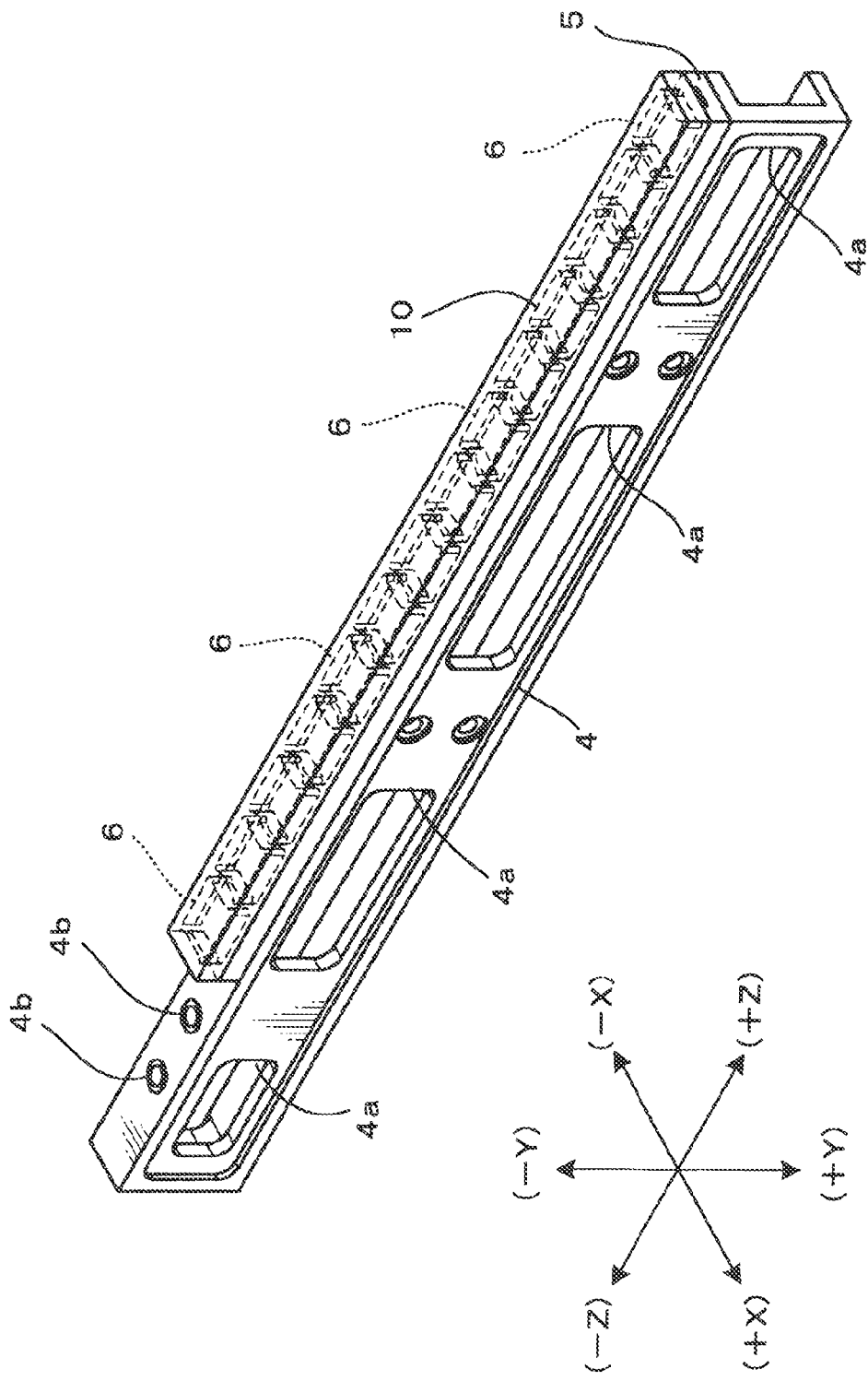
FIG. 6 is a perspective view showing an assembled structure of a movable member and the mover in the mode of implementation illustrated in FIG. 1.
Figure 7:
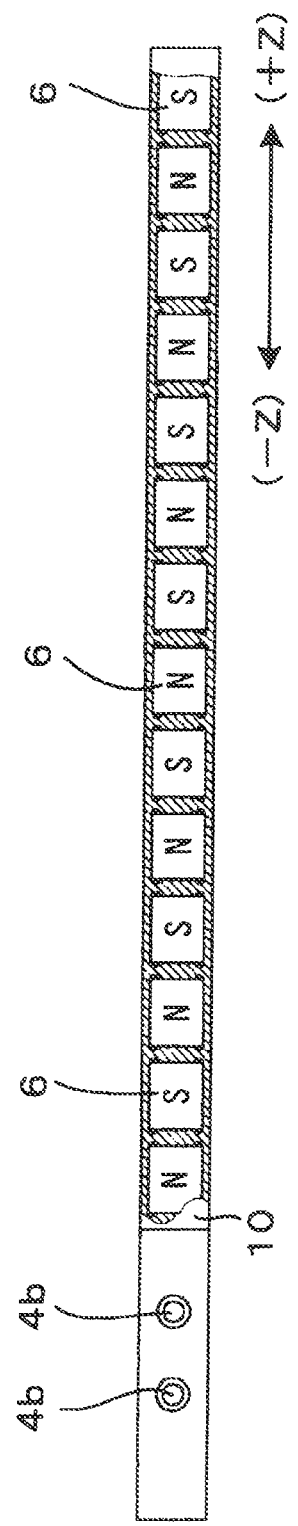
FIG. 7 is a diagram showing the assembled structure of the movable member and the mover in the mode of implementation illustrated in FIG. 1.
Figure 8:
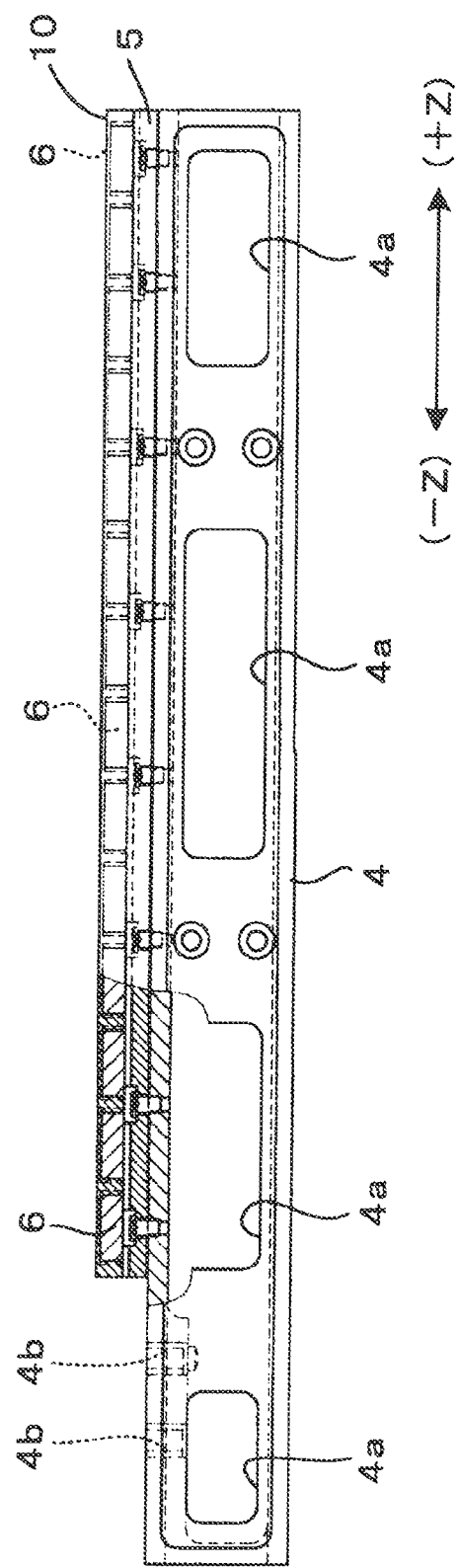
FIG. 8 is a partially broken-out side view showing the assembled structure of the movable member and the mover in the mode of implementation illustrated in FIG. 1.

Referring next to FIGS. 6 to 8, a yoke 5 made of a ferromagnetic material is attached to a lateral surface of the movable base 4 on the one edge side (-Y side) in the widthwise direction Y. A permanent magnet array 6 is attached to a surface of the yoke 5 in a line, in such a manner that a permanent magnet of which an N-pole is opposed to the surface and a permanent magnet of which an S-pole is opposed to the surface are alternately arranged along the moving direction Z (in the single-shaft linear motor LM, total fourteen permanent magnets). A mover 10 of the single-shaft linear motor LM is made up of the permanent magnet array 6 and the yoke 5. In the single-shaft linear motor LM, the permanent magnet array 6 is molded within a resin layer constituting an outer shell of the mover 10, to protect a surface thereof, which makes it possible to effectively prevent damage or the like of the permanent magnet array 6. The resin layer covers the permanent magnet array 6, leaving a space on the forward side (-Z side) in the moving direction Z with respect to the mover 10, so that a portion of the lateral surface of the movable base 4 on the forward side with respect to the mover 10 is exposed.

Two female screw portions 4*b* are formed in the exposed region of the movable base 4 along the moving direction Z. The female screw portions 4*b* are one example of coupling means for attaching a driven object to an end of the movable base 4 on the one edge side directly or through a coupling unit 164 (see FIG. 20). For example, in an after-mentioned surface mounter, the coupling unit 164 (see FIG. 20) is coupled to the movable base 4 using the female screw portions 4*b*, and then a nozzle shaft as a driven object is connected to the coupling unit 164. Namely, a driven object can be attached to the movable base 4 through the coupling unit 164 coupled to the end of the movable base 4 using the female screw portions 4*b*. This point will be more specifically described in the following "SURFACE MOUNTER" Section.

Figure 2:
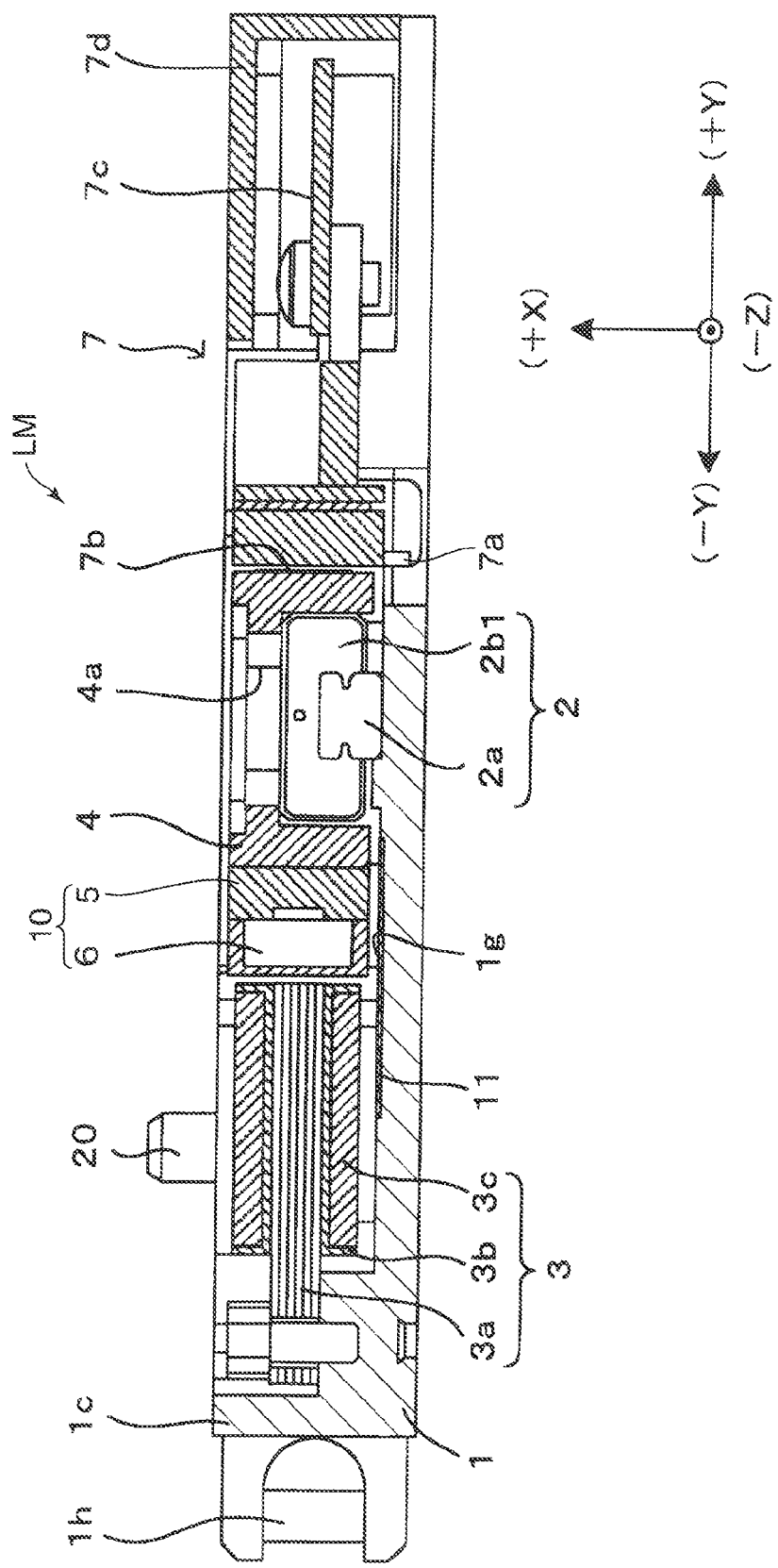
FIG. 2 is a sectional view taken along the arrowed line II-II in FIG. 1.

Referring next to FIG. 2, an armature 3 as one example of a "stator" in the appended claims is, disposed on the one edge side in the widthwise direction Y with respect to the mover 10 made up of the yoke 5 and the permanent magnet array 6 as described above, and fixed to the base surface 1*a* of the base plate 1. The armature 3 comprises a core 3*a*, a plurality of hollow-shaped bobbins 3*b*, and a plurality of coils 3*c* each of which is formed by winding an electric wire around respective outer peripheries of the bobbins 3*b*. The core 3*a* is formed by stacking, in a frontward-rearward direction X, a plurality of comb-shaped silicon steel plates (unit plates) each having a longitudinal direction extending on a Y-Z plane and along the moving direction Z. The pile of silicon steel plate forms teeth on the other edge side (+Y side) in the widthwise direction Y, at regular intervals along the moving direction Z. In the core 3*a* designed in this manner, the teeth are arranged side by side in a line at regular intervals in the moving direction Z to form a tooth array. Then, the bobbins 3*b* each pre-wound with the coil 3*c* are mounted to respective ones of the teeth. In this manner, an array of a plurality of (in the single-shaft linear motor LM, nine) teeth of the core 3*a* and a plurality of coils 3*c* wound around the tooth array are provided at the same intervals along the moving direction Z to form the armature 3, which is disposed opposed to the mover 10. In the single-shaft linear motor LM, as shown in FIG. 3, the armature 3 is formed such that each of a distal end surface 8 (surface on the +Y side) of the teeth of the core 3*a* wound with the coils 3*c*, and a counter surface 8' of the permanent magnet array 6 of the mover 10 opposed to the distal end surface 8, becomes parallel to an X-Z plane including the frontward-rearward direction X and the moving direction Z. When a current is applied to respective ones of the coils 3*c* in a given sequence from a motor controller whose illustration is omitted, a propulsion force in the moving direction Z is generated in the mover 10 by interaction between the magnetic pole of the distal end surface 8 and the magnetic pole of the counter surface 8' arranged as described above, so that the movable base 4 is driven in the moving direction Z.

Figure 9:
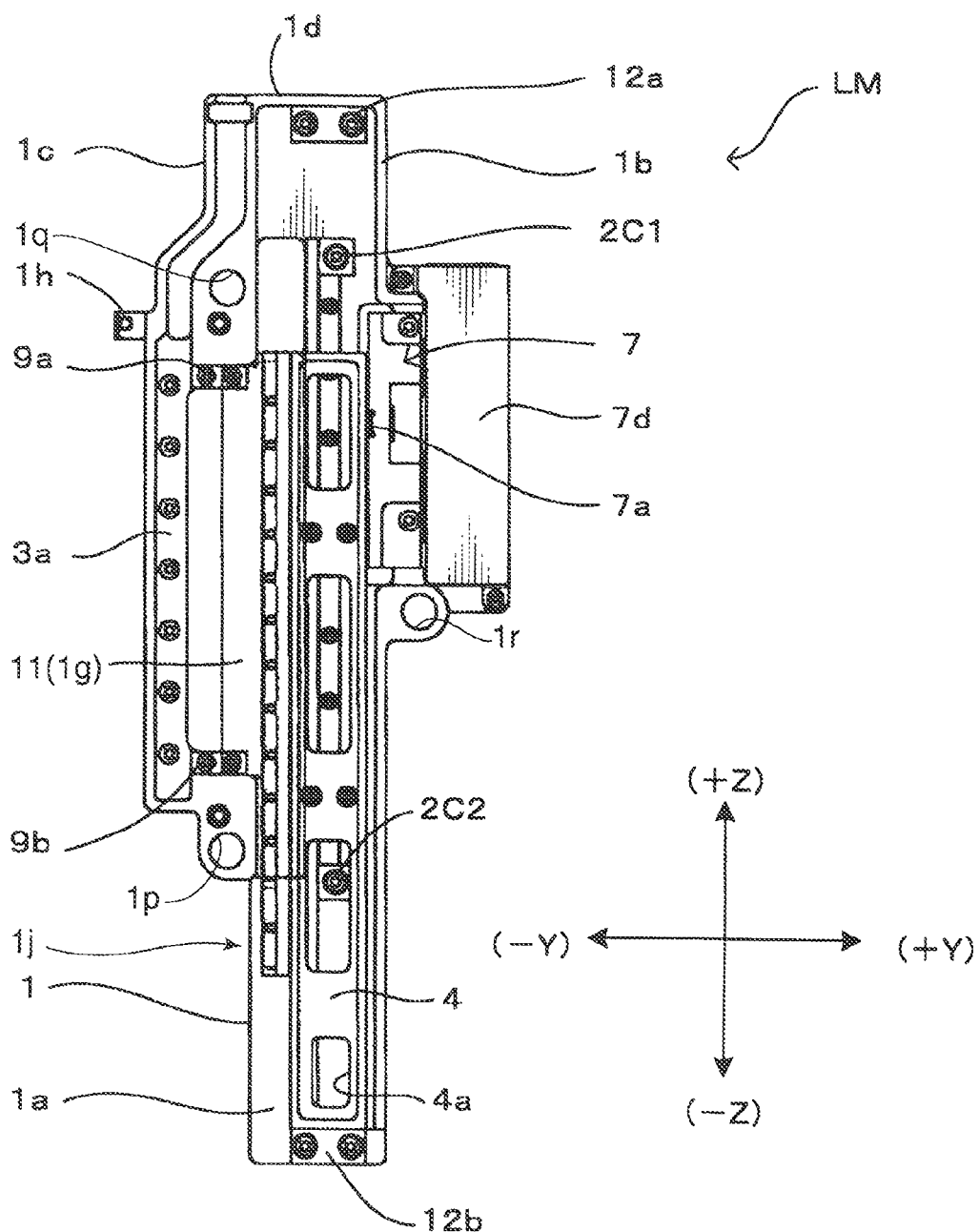
FIG. 9 is a front view showing an arrangement relationship between a magnetic plate and each of two sub-teeth in the mode of implementation illustrated in FIG. 1.

In the single-shaft linear motor LM, the permanent magnet array 6 is used in the mover 10, and the core 3*a* made of a magnetic material is used in the armature 3 serving as the stator. Thus, a cogging force is generated between the tooth array of the core 3*a* and the permanent magnet array 6 of the mover 10. As is well known, the "generation of a cogging force" is a phenomenon that a magnetic flux density of the permanent magnet array 6 is changed depending on a position of the teeth of the core 3*a*, and thereby magnetic energy is changed to cause a pulsation of an electromagnetic force acting on the armature 3. Therefore, in order to reduce a cogging force, two sub-teeth 9*a* and 9*b* each made of a magnetic material are provided at respective opposite ends of the tooth array of the armature 3, as shown in FIG. 9. Specifically, the sub-tooth 9*a* and the sub-tooth 9*b* are detachably provided on the base surface 1*a* of the base plate 1, respectively, at a desired position identical to or different from a tooth array pitch, in a backward-side (+Z-side) portion of the tooth array, and a desired position identical to or different from the tooth array pitch, in a forward-side (−Z-side) portion of the tooth array, in such a manner that a distance from the permanent magnet array 6 becomes a desired value.

In the single-shaft linear motor LM designed as described above, a region of the base plate connected to the core 3a extends to a vicinity of the sub-teeth 9a and 9b, so that a magnetic coupling between the core 3a of the armature 3 and each of the sub-teeth 9a and 9b occurs to cause unevenness in magnetic flux density distribution. Thus, it is likely that a stable cogging-force reducing function cannot be obtained simply by arranging the sub-teeth 9a and 9b at given positions. In particular, during acceleration, deceleration, or the like, or in a situation where an operating condition (a constant movement speed after acceleration) itself changes, an amount of current flowing through the coils 3c is likely to change and deviate from an assumed value to cause difficulty in desirably forming a magnetic pole of a counter surface of the sub-teeth 9a and 9b opposed to the permanent magnet array 6 or an intensity of the magnet pole, so that a cogging-force reducing effect based on the sub-teeth 9a and 9b is not always obtained. Therefore, in this mode of implementation, a magnetic plate 11 is provided between the base plate 1 and each of the sub-teeth 9a and 9b to supplement the cogging-force reducing effect based on the sub-teeth 9a and 9b. More specifically, the single-shaft linear motor is designed as follows.

Referring to FIGS. 5 and 9, a plate-fitting portion 1g is formed on the base surface 1a of the base plate 1 to have a shape approximately equal to a planar shape of the magnetic plate 11 (see FIG. 5). The plate-fitting portion 1g is formed in a position where the magnetic plate 11 is disposed opposed to both the mover 10 and the armature 3 in the frontward-rearward direction X. Also, as shown in FIG. 2, when the magnetic plate 11 is fitted in the plate-fitting portion 1g, a front surface of the magnetic plate 11 is flush with the base surface 1a. Based on providing the magnet plate 11, it becomes possible to generate a magnet flux passing through the sub-tooth 9a, one permanent magnet in the permanent magnet array 6, the yoke 5 and the magnetic plate 11, and reaching the sub-tooth 9a, on the X-Y plane, in addition to a magnetic flux passing through the core 3a, the sub-tooth 9a, one permanent magnet in the permanent magnet array 6, the yoke 5, an adjacent permanent magnet in the permanent magnet array 6, and an adjacent one of the teeth and reaching the core 3a, on the Y-Z plane, so as to effectively reduce the cogging force.

As mentioned above, the movable base 4 is driven in the moving direction Z by interaction of magnetic fluxes generated between the mover 10 and the armature 3. In this connection, two movement restriction stoppers 12a and 12b are detachably fixed to the base surface 1a of the base plate 1 to prevent the movable base 4 from being moved beyond a given moving range.

To detect accurately a position of the movable base 4, a detector unit 7 having a sensor 7a and a linear scale 7b to serve as detection means is provided on a side opposite to the armature (i.e., on the +Y side) with respect to the movable base 4.

Referring to FIGS. 2 and 5, the sensor 7a of the detector unit 7 is integrally assembled to a sensor control unit 7c. This assembly (the sensor 7a+the sensor control unit 7c) is adapted to be detachable relative to the recess portion 1e through a cutout 1f formed in the standing wall 1b, as shown in FIG. 5. In an operation of mounting the assembly, the assembly is fixed to the base plate 1 in such a manner as to allow the sensor 7a to face inside the recess portion 1e of the base plate 1 and allow the sensor control unit 7c to be disposed on a side opposite to the linear scale, i.e., on the other edge side (+Y side) in the widthwise direction Y, with respect to the sensor 7a.

The linear scale 7b on the other hand is provided on a lateral surface of the movable base 4 on the other edge side (+Y side) to extend along the moving direction Z. The sensor 7a is disposed opposed to the linear scale 7b in the widthwise direction Y during the operation of mounting the assembly (the sensor 7a+the sensor control unit 7c). Particularly, in this mode of implementation, respective mounting positions of the sensor 7a and the linear scale 7b are set such that each of a surface 7e of the linear scale 7b and a sensing surface 7e' of the sensor 7a opposed to the surface 7e becomes parallel to the X-Z plane including the frontward-rearward direction X and the moving direction Z, as shown in FIG. 4. This makes it possible to allow a region of the linear scale 7b opposed to the sensor 7a to be displaced in response to a displacement of the movable base 4 along the moving direction Z, and to accurately detect a position of the movable base 4 in the moving direction Z based on the displacement of the region of the linear scale 7b.

Also, in order to prevent foreign substances, such as dust or foreign particles, from getting into the sensor control unit 7c, a sensor cover 7d (see FIG. 2) is attached to the standing wall 1b of the base plate 1 after the mounting of the assembly to cover the sensor control unit 7c.

In the single-shaft linear motor LM, the linear scale 7b is attached to the movable base 4, and the sensor 7a is disposed on the base plate 1. Alternatively, the sensor 7a and the linear scale 7b may be arranged in the reverse relation. Also, the detector unit 7 may be designed such that one of the components (the sensor 7a and the linear scale 7b) thereof is attached to the sliders 2b1 and 2b2, instead of attaching it to the movable base 4. A detection scheme of the detector unit 7 may be a magnetic scheme using magnetism, or an optical scheme.

Figure 1:
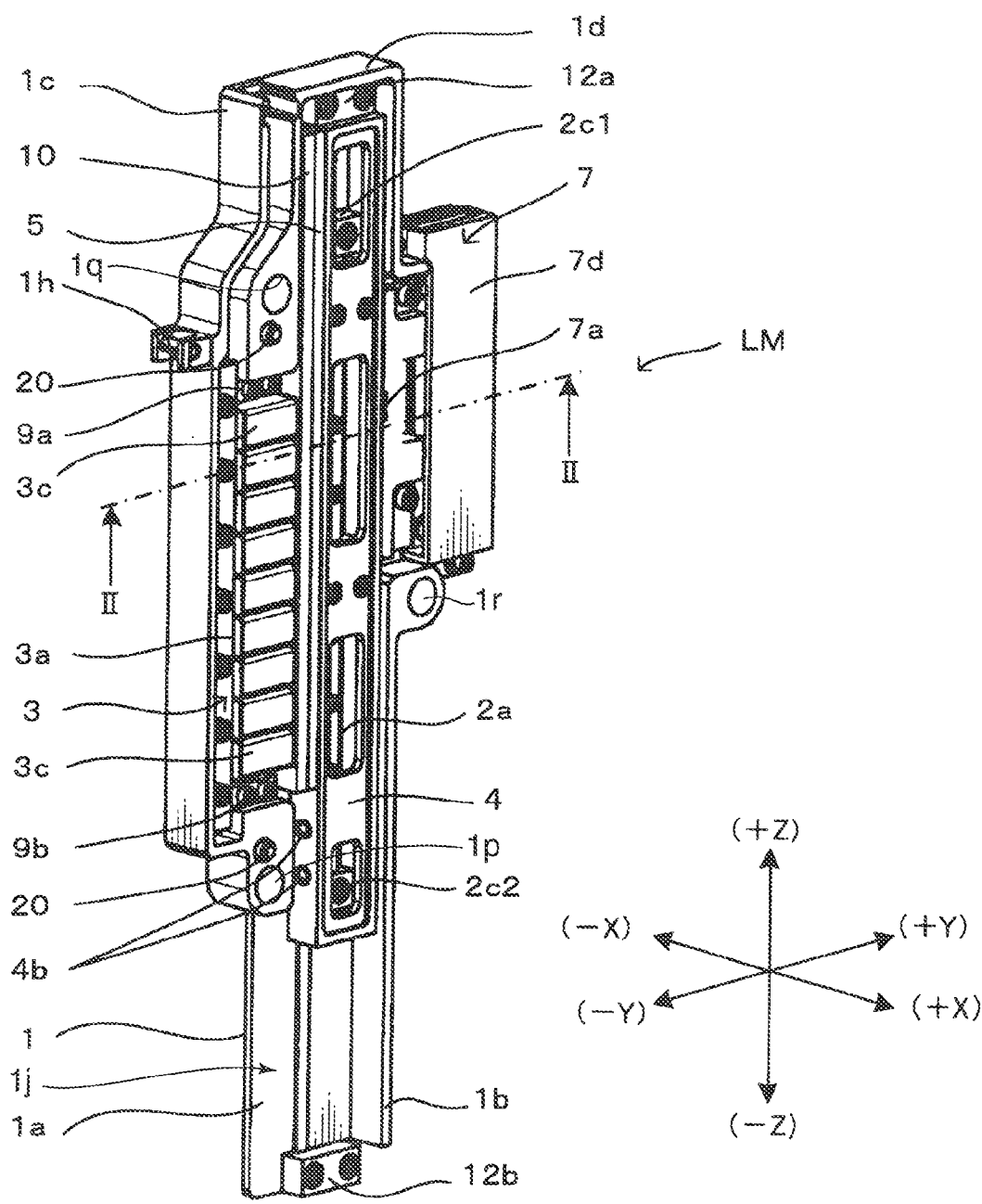
FIG. 1 is a perspective view of a single-shaft linear motor in one mode of implementation of the present invention.

In order to constitute a multi-shaft linear motor MLM by positioning and connecting a plurality of the single-shaft linear motors LM with each other, the single-shaft linear motor LM has following structures. That is, the base plate 1 is formed with a set of two through-holes 21 (see FIG. 5) which open in the frontward-rearward direction X. A positioning pin 20 is fixed to each of the two through-holes 21 leaving some space on a bottom side of the through-hole 21. The positioning pin 20 is fixed to allow a frontward side (+X side) portion to protrude from the through-hole 21, so that, in an assembling operation of two single-shaft linear motors LM1 and LM2, each of the positioning pins 20 of the single-shaft linear motor LM1 on a bottom side thereof is fitted into a corresponding one of the through-holes 21 of the single-shaft linear motor LM2 on a top side thereof to establish positioning. Thus, in this mode of implementation, the "positioning pins 20" and the "through-holes 21" serve as a "bottom-side engagement section" and a "top-side engagement section" in the appended claims, respectively. It is understood that the positioning pin 20 may also be fixed to the through-hole 21 in each of the single-shaft linear motors LM leaving some space on a top side of the through-hole 21, so as to allow a portion of the positioning pin 21 on the rearward side (−X side in the frontward-rearward direction X) to protrude from the through-hole 21. As shown in FIGS. 1 to 5, three through-holes 1p to 1r are formed in the base plate 1 of the single-shaft linear motor LM to be penetrated therethrough in the frontward-rearward direction X. Specifically, two 1p, 1q of the three through-holes are formed in the standing wall 1b at positions across the armature 3 in the moving direction Z, and the remaining through-hole 1r is formed in the standing wall 1b on the other edge side (+Y side) in the widthwise direction Y. The three through-holes 1p to 1r formed in this manner are located at positions across the mover 10 as shown in FIG. 1, and arranged in a generally isosceles triangle shape when viewed from the frontward side.

<Multi-Shaft Linear Motor>

Figure 10:
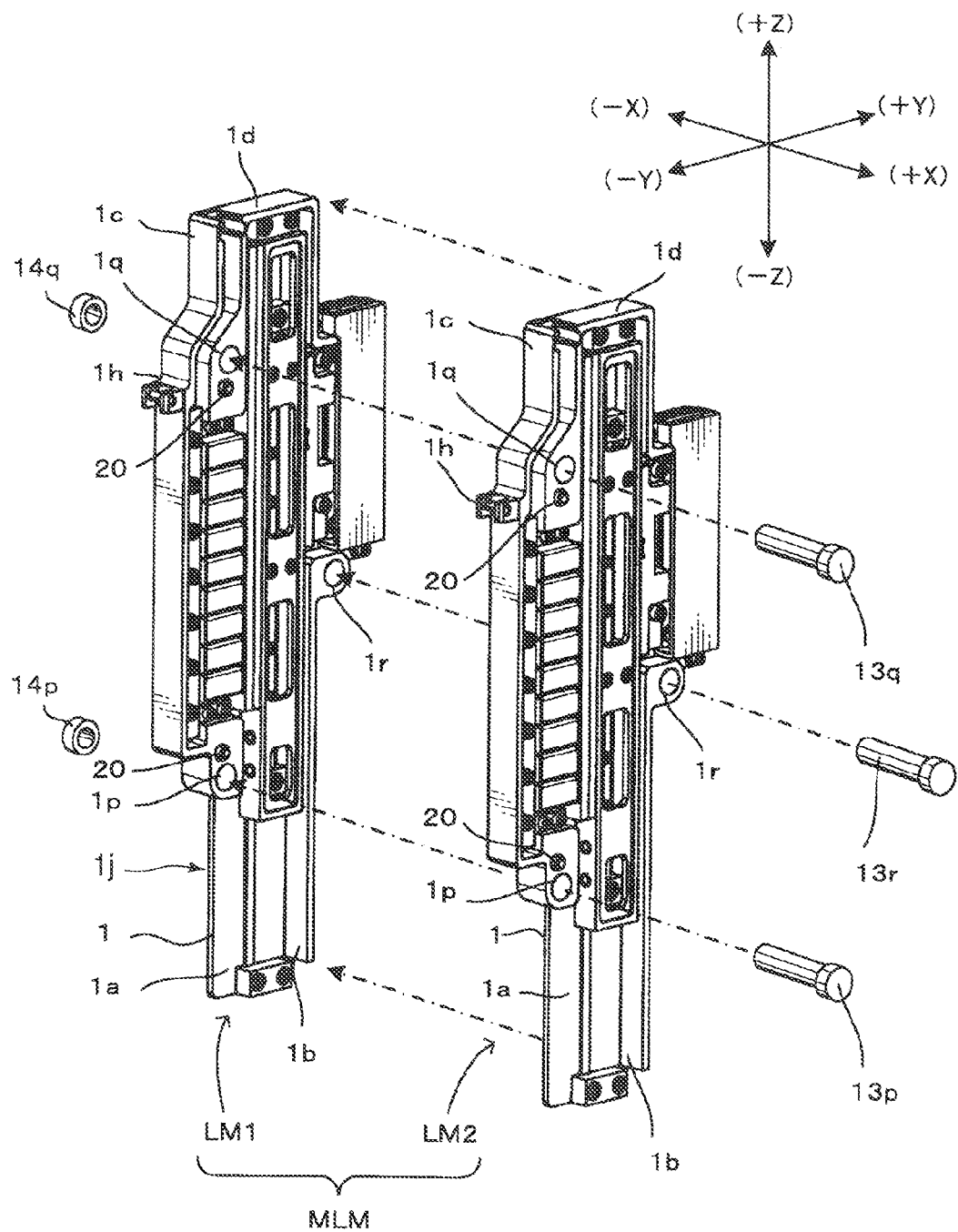
FIG. 10 is a perspective view showing a pre-assembled state of a multi-shaft linear motor according to a first embodiment of the present invention.
Figure 11:
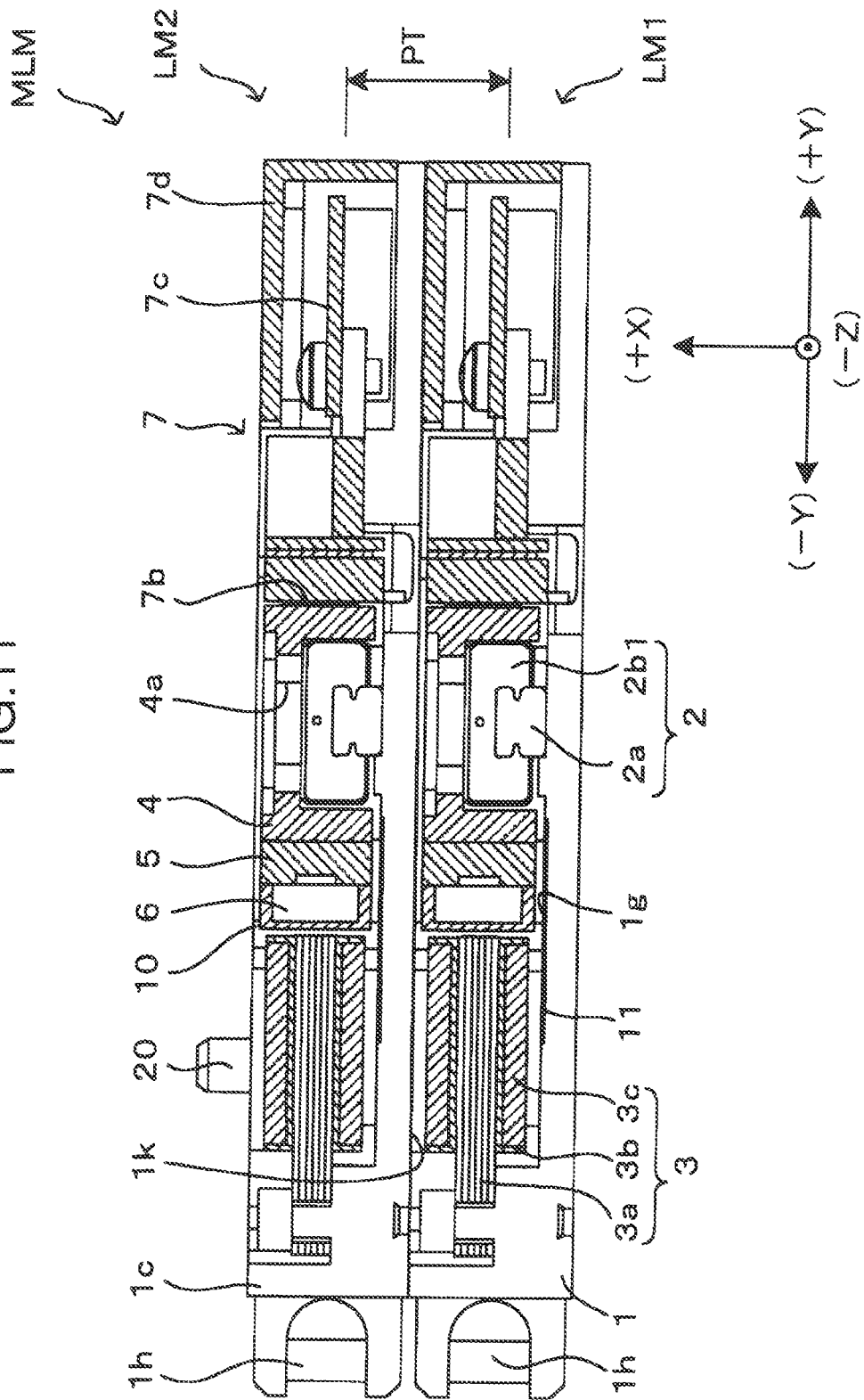
FIG. 11 is a sectional view showing an assembled state of the multi-shaft linear motor in FIG. 10.

FIG. 10 and FIG. 11 are, respectively, a perspective view and a sectional view showing a multi-shaft linear motor according to a first embodiment of the present invention. In the first embodiment, a multi-shaft linear motor MLM is formed by preparing two single-shaft linear motors LM1 and LM2, each having the same structure as that of the aforementioned single-shaft linear motor LM. These single-shaft linear motors LM1 and LM2 are stacked in such a manner that tops (front surfaces) of the standing walls 1b to 1d of one single-shaft linear motor LM1 are piled with a rear surface of the base plate 1 of the single-shaft linear motor LM2 along the frontward-rearward direction X. More specifically, the base plate 1 of each of the single-shaft linear motors LM1 and LM2 are formed with the three through-holes 1p to 1r each one of a pair of through-holes opposed in the frontward-rearward direction X. A bolt 13p is inserted from the frontward side (+X side) of the single-shaft linear motor LM2 to penetrate through the through-holes 1p of the single-shaft linear motors LM1 and LM2, and a nut 14p is screwed on a distal end of the bolt 13p from the rearward side (−X side) of the single-shaft linear motor LM1. In the same manner as that for the through-holes 1p, two bolts 13 and 13r are inserted into the through-holes 1q and 1r, respectively, and a nut 14q is screwed on each of the bolts 13 and 13r. In this manner, the single-shaft linear motors LM1 and LM2 are fixedly fastened at three positions and integrated together to form a two-shaft linear motor MLM. Thus, the bolts 13p to 13r and the nuts 14p to 14q serve as a "fastener member" in the appended claims.

As mentioned above, in the first embodiment, the multi-shaft linear motor MLM is formed by stacking the two single-shaft linear motors LM1 and LM2. The two movable bases 4 in the multi-shaft linear motor MLM are positioned in a relative positional relationship which corresponds to a stacked arrangement of the single-shaft linear motors LM1 and LM2. In the first embodiment, each of the single-shaft linear motors LM1 and LM2 has the same structure (FIG. 1), and the multi-shaft linear motor MLM has a stacked structure where the two base plates 1 of the single-shaft linear motors LM1 and LM2 are directly stacked each other, so that a pitch PT between the movable bases 4 in a stacking direction (frontward-rearward direction X) becomes equal to a depth dimension of each of the single-shaft linear motors LM1 and LM2. In this way, the stacked arrangement of the single-shaft linear motors LM1 and LM2 enables the movable bases 4 to be arranged with excellent relative positional accuracy in the stacking direction (frontward-rearward direction X), and to be driven independently. Also, the positioning of the single-shaft linear motors LM1 and LM2 are secured, at the boundary between the single-shaft linear motors LM1 and LM2 which are located adjacent to each other in the stacking direction (frontward-rearward direction X), by engaging the positioning pins (bottom-side engagement section) 20 provided in the bottom-side single-shaft linear motor LM1 located on a bottom side in the stacking direction (frontward-rearward direction X) (a lower side in FIG. 11) with the corresponding through-holes (top-side engagement section) 21 provided in the top-side single-shaft linear motor LM2 located on a top side in the stacking direction (frontward-rearward direction X) (an upper side in FIG. 11). This makes it possible to further enhance the relative positional accuracy.

Also, the multi-shaft linear motor MLM is formed by stacking the single-shaft linear motors LM1 and LM2 each having the same structure as that of the single-shaft linear motor LM illustrated in FIG. 1, so that the pitch PT can be shortened. Specifically, in the single-shaft linear motor LM (LM1 and LM2) illustrated in FIG. 1, the coils 3c of the armature 3, which forms the stator, and the mover 10 are disposed side by side in the widthwise direction Y. Thus, as compared with a structure where an armature, a permanent magnet array, a yoke, and a movable base are arranged in the stacking direction (frontward-rearward direction X) with respect to the base plate 1, a thickness of the linear motor LM can be reduced, and thereby the pitch PT can be shortened.

In the single-shaft linear motor LM (LM1 and LM2), an attachment position of the mover 10 to the movable base 4 is the lateral surface of movable base 4 on the one edge side (−Y side) in the widthwise direction Y, and the armature 3 is provided in opposed relation to the mover 10 attached to the lateral surface. Thus, as compared with a structure where a mover is disposed on an upper surface of the movable base 4, the thickness of the linear motor LM can be further reduced, and thereby the pitch PT can be further shortened.

Also, as shown in FIG. 11, the tops of the standing walls of the bottom-side single-shaft linear motor LM1 located on the bottom side in the stacking direction is in contact with the rear surface 1k of the base plate 1 of the top-side single-shaft linear motor LM2 located on the top side of and adjacent to the bottom-side single-shaft linear motor LM1, so that the containing space (internal space of the recess portion 1e) of the bottom-side single-shaft linear motor LM1 is covered by the surface 1k of the base plate 1 of the top-side single-shaft linear motor LM2 on the side opposite to the base surface. Thus, the base plate 1 of the top-side single-shaft linear motor LM2 serves as a cover member for the bottom-side single-shaft linear motor LM1. This enables not only to effectively prevent foreign substances from getting in, but also to shorten the thickness of the single-shaft linear motor in the stacking direction (frontward-rearward direction X) to be suppressed, which results in further shortening the pitch PT between the single-shaft linear motors LM1 and LM2.

While the two single-shaft linear motors LM1 and LM2 are stacked to form the two-shaft linear motor MLM in the first embodiment, the multi-shaft linear motor may consist of three or more single-shaft linear motors (ten-shaft linear motor is used in an after-mentioned surface mounter). In fact, the number of single-shaft linear motors to be stacked can be variously set to readily change the number of the movable bases 4. Thus, the first embodiment is excellent in versatility. Also, each of the single-shaft linear motors LM1 and LM2 (the base plate 1) can be handled as a separate unit, so that it is not necessary to disassemble the stator and the mover in assembling or maintenance of the multi-shaft linear motor MLM. Thus, in a maintenance operation, such as inspection or repair, which is performed with respect to each of the single-shaft linear motors LM1 and LM2 constituting the multi-shaft linear motor MLM, a target one of the single-shaft linear motors can be selectively taken out from the multi-shaft linear motor MLM to perform inspection, repair or the like. Thus, the first embodiment is also excellent in terms of maintenance serviceability.

Also, because of the common bolts 13p to 13r, which are inserted into the corresponding through-holes 1p to 1r in the respective single-shaft linear motors LM1 and LM2 to fasten these motors, the operations for fastening the linear motors can be efficient. Furthermore, the number of fastening members can be reduced as compare with a case where single-shaft linear motors are individually connected one by one. This facilitates a reduction in production cost of the multi-shaft linear motor MLM.

The multi-shaft linear motor MLM, which is formed by using the single-shaft linear motors LM1 and LM2 which are the same structure as that of the single-shaft linear motor LM illustrated in FIG. 1, also has the following advantages. In the single-shaft linear motor LM, each of the standing walls 1b and 1c extends from a respective one of the opposite edges of the base plate 1 in the widthwise direction Y toward the frontward side with respect to the base surface 1a, as shown in FIG. 5. The recess portion 1e, which is surrounded by the standing walls 1b and 1c and the base surface 1a, defines the containing space opened toward the frontward side with respect to the base surface 1a. Accordingly, because the opening of the base plate 1 defined in this manner has broadening in the moving direction Z and the widthwise direction Y, an operator can access the recess portion 1e (containing space) from the frontward side through the opening. This also facilitates visual check during assembling to allow an operator to readily check a positional relationship between the stator and the mover. Therefore, as is clear from FIG. 5, any elements of the linear motor LM can be readily inserted into the recess portion 1e through the opening. Thus, in the first embodiment, a production/assembling operation of the linear motor LM can be facilitated. Similarly, in an operation, such as maintenance or repair, for the single-shaft linear motor, the movable section and the mover can be dealt as a single unit to be disassembled from or re-assembled to the linear motor, making it possible to reduce time and effort for the disassembling and re-assembling.

In the embodiment, the plurality of standing walls 1b to 1d including the standing walls 1b and 1c are integrally formed with the base plate 1, so that the rigidity of the base plate 1 is improved. Also, all of the movable section (sliders 2b1 and 2b2), the stator (armature 3) and the mover 10 are set up in the internal space (containing space) of the recess portion 1e. Based on employing these structures, the strength of the single-shaft linear motor LM is improved. In addition to the advantage in terms of strength, the formation of the standing walls 1b to 1d also contributes to effectively preventing foreign substances outside the motor from getting in.

A standing wall may be formed on the entire peripheral edge of the base plate 1. However, in this case, design factors, such as sizes of the linear guide 2 and the movable base 4 in the moving direction; a moving range of the movable section; or the like will be significantly restricted by the presence of two walls located on the forward and backward sides in the moving direction Z in opposed relation. Moreover, a position for coupling a driven object to the movable base 4 will be limited to the frontward side. In contract, in the single-shaft linear motor LM, the open zone 1j is defined at the forward-side (−Z side) end of the base plate 1, so that the internal space (containing space) of the recess portion 1e is opened through the open zone 1j. Based on providing the open zone 1j in this manner, a driven object (such as an after-mentioned nozzle shaft) coupled by the forward-side (−Z side) end or the female screw portions 4b can be moved to get in and out of the internal space of the recess portion 1e according to driving of the movable base 4 in the moving direction Z. This makes it possible to expand the moving range of not only the movable base 4 provided in the single-shaft linear motor but also each of the movable bases 4 provided in the multi-shaft linear motor MLM (and the driven object coupled to the movable base 4), to obtain a single-shaft linear motor LM having high versatility.

The multi-shaft linear motor of the present invention is not limited to the above embodiment, but various changes and modifications other than those described above may be made therein without departing from the spirits and scope of the invention. For example, although each of the single-shaft linear motors constituting the multi-shaft linear motor MLM according to the first embodiment has the same structure, a different type of single-shaft linear motor may be combined therewith.

Figure 12:
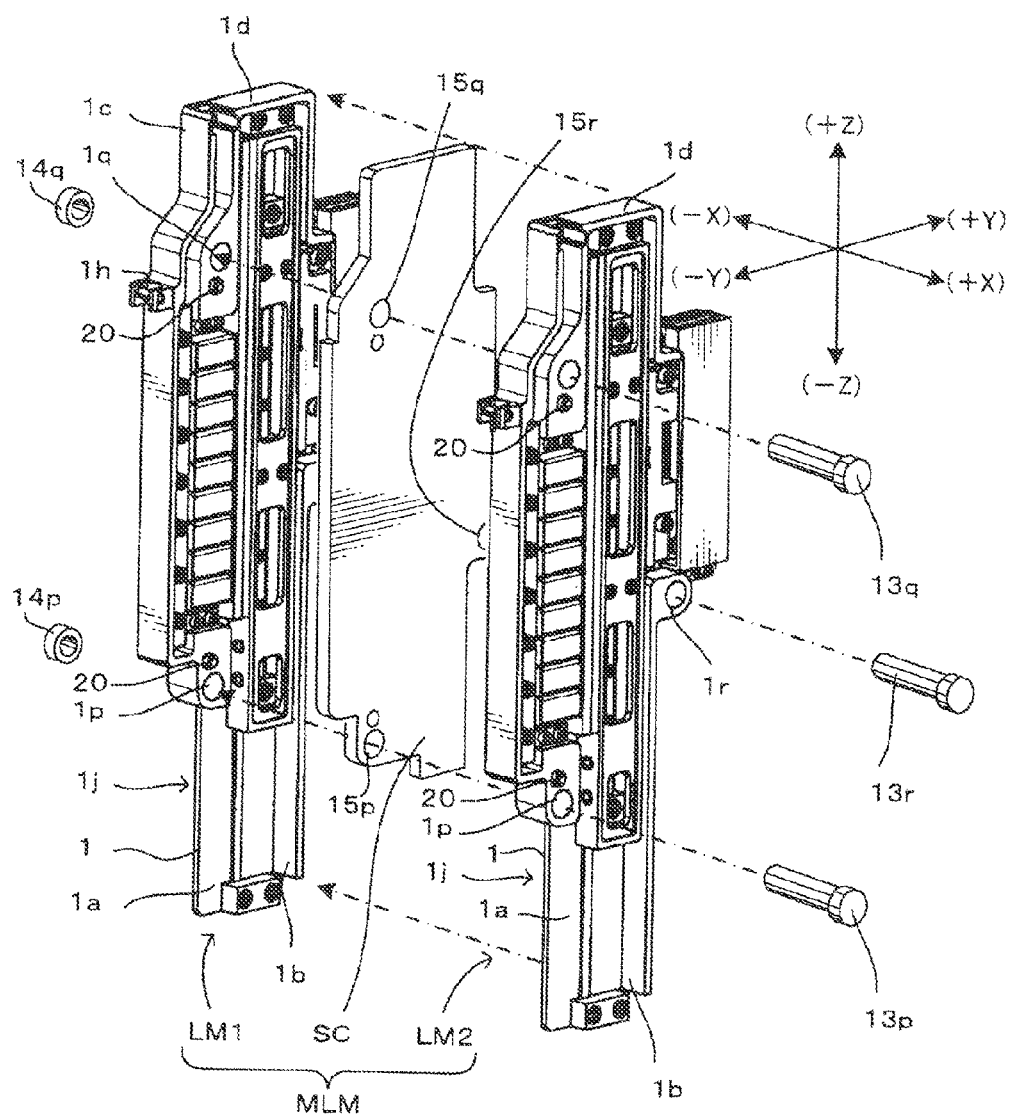
FIG. 12 is a perspective view showing a pre-assembled state of a multi-shaft linear motor according to a second embodiment of the present invention.
Figure 13:
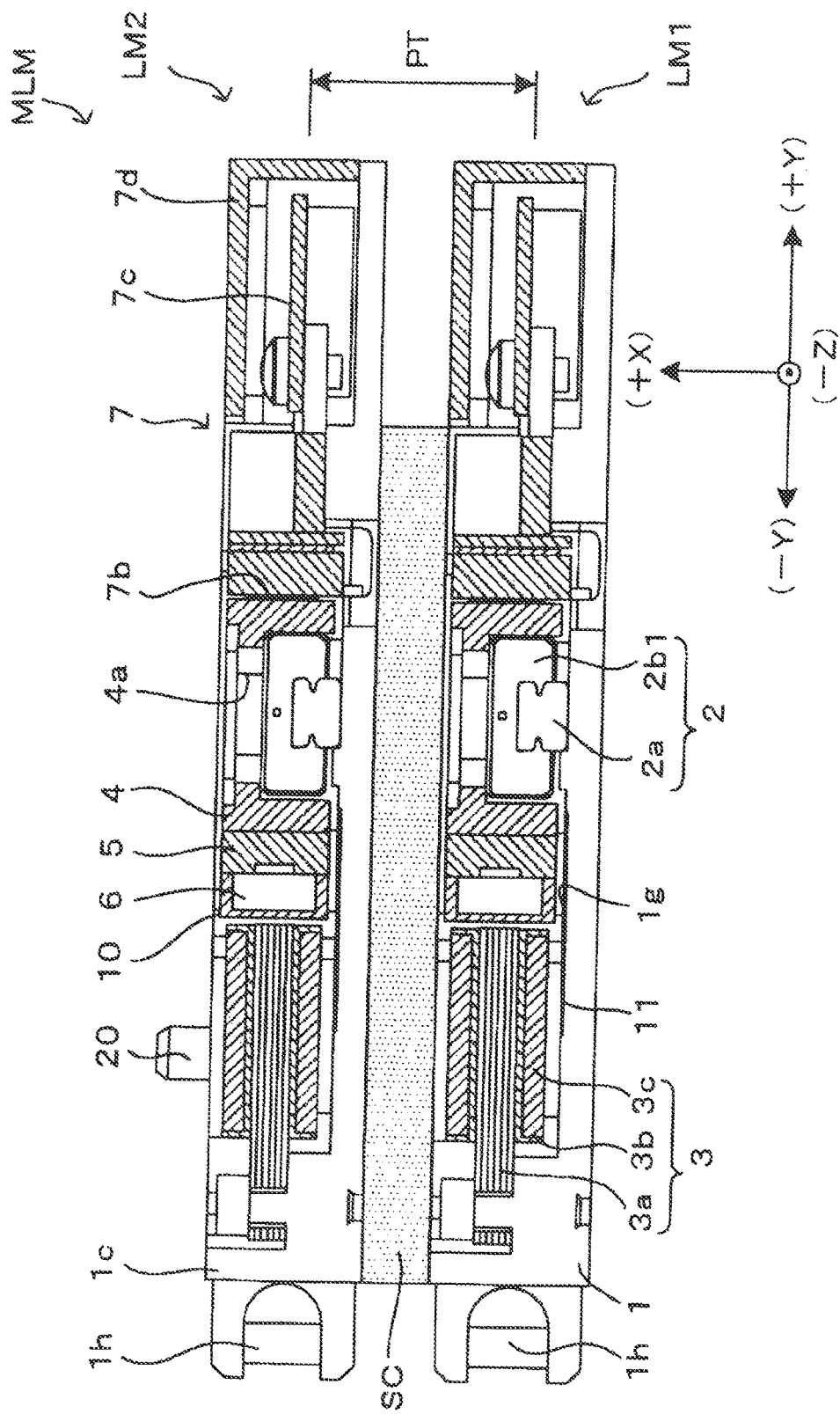
FIG. 13 is a sectional view showing an assembled state of the multi-shaft linear motor in FIG. 12.

In the multi-shaft linear motor MLM according to the first embodiment, the pitch PT between the movable bases 4 in the stacking direction is automatically determined in unique by the size of the single-shaft linear motors LM1 and LM2 in the frontward-rearward direction. Alternatively, as shown in a second embodiment illustrated in FIGS. 12 and 13, a pitch adjustment plate SC may be interposed at a boundary position where the single-shaft linear motors LM1 and LM2 are located adjacent to each other in the stacking direction (frontward-rearward direction X). Because of the interposition of the pitch adjustment plate SC, the pitch PT between the single-shaft linear motors LM1 and LM2 is increased by a thickness of the pitch adjustment plate SC. A distance between the single-shaft linear motors LM1 and LM2 in the stacking direction (frontward-rearward direction X) can be adjusted by interposing the pitch adjustment plate SC therebetween, so that the pitch PT between the movable bases 4 in the stacking direction (frontward-rearward direction X) can be adjusted easily and with a high degree of accuracy. If the multi-shaft linear motor MLM contains three or more single-shaft linear motors, the number of the boundaries where two of the single-shaft linear motors are located adjacent to each other in the stacking direction (frontward-rearward direction X) will be increased up to two or more. In such a multi-shaft linear motor MLM having the plurality of boundary positions, the pitch adjustment plate SC may be inserted into each of the boundary positions or may be inserted into a part of the boundary positions, depending on design of the multi-shaft linear motor MLM.

In the multi-shaft linear motor MLM according to the first embodiment, a plurality of the single-shaft linear motors LM illustrated in FIG. 1 are assembled together. Alternatively, each of the single-shaft linear motors LM may be designed as follows. In the single-shaft linear motor LM illustrated in FIG. 1, the mover and the armature (stator) 3 are disposed on the only one edge side (−Y side) in the widthwise direction Y with respect to the movable base 4 to drive the movable base 4. Alternatively, the mover and the armature (stator) 3 may be additionally disposed on the other edge side (+Y side) in the widthwise direction Y with respect to the movable base 4. This makes it possible to further increase a propulsion force for driving the movable base 4. Also, the single-shaft linear motor LM constituting the multi-shaft linear motor MLM may be designed to form a magnetic circuit in such a manner that the movable base 4 is made of a ferromagnetic material, and the permanent magnet array 6 is provided directly on the lateral surface of the movable base 4 on the one or other edge side in the widthwise direction Y to extend in the moving direction Z. In the single-shaft linear motor LM, the yoke 5 may be attached to respective lateral surfaces of the sliders 2b1 and 2b2 on the one or other edge side in the widthwise direction Y, and then the permanent magnet array 6 may be attached to the yoke 5. In this case, the sliders 2b1 and 2b2 are equivalent to the "movable section" in the appended claims. Also, a magnetic circuit may be formed in such a manner that the sliders are made of a ferromagnetic material, and the permanent magnet array 6 is provided directly on respective lateral surfaces of the sliders on the one or other edge side in the widthwise direction Y to extend in the direction Z. In the single-shaft linear motor LM illustrated in FIG. 1, the mover is made up using the permanent magnet array 6, and the stator is made up using the armature 3. Alternatively, the multi-shaft linear motor may be formed using a single-shaft linear motor comprising a mover made up using an armature, and a stator made up using a permanent magnet array.

The sectional shape of the movable base 4 may be an H shape.

Figure 14:
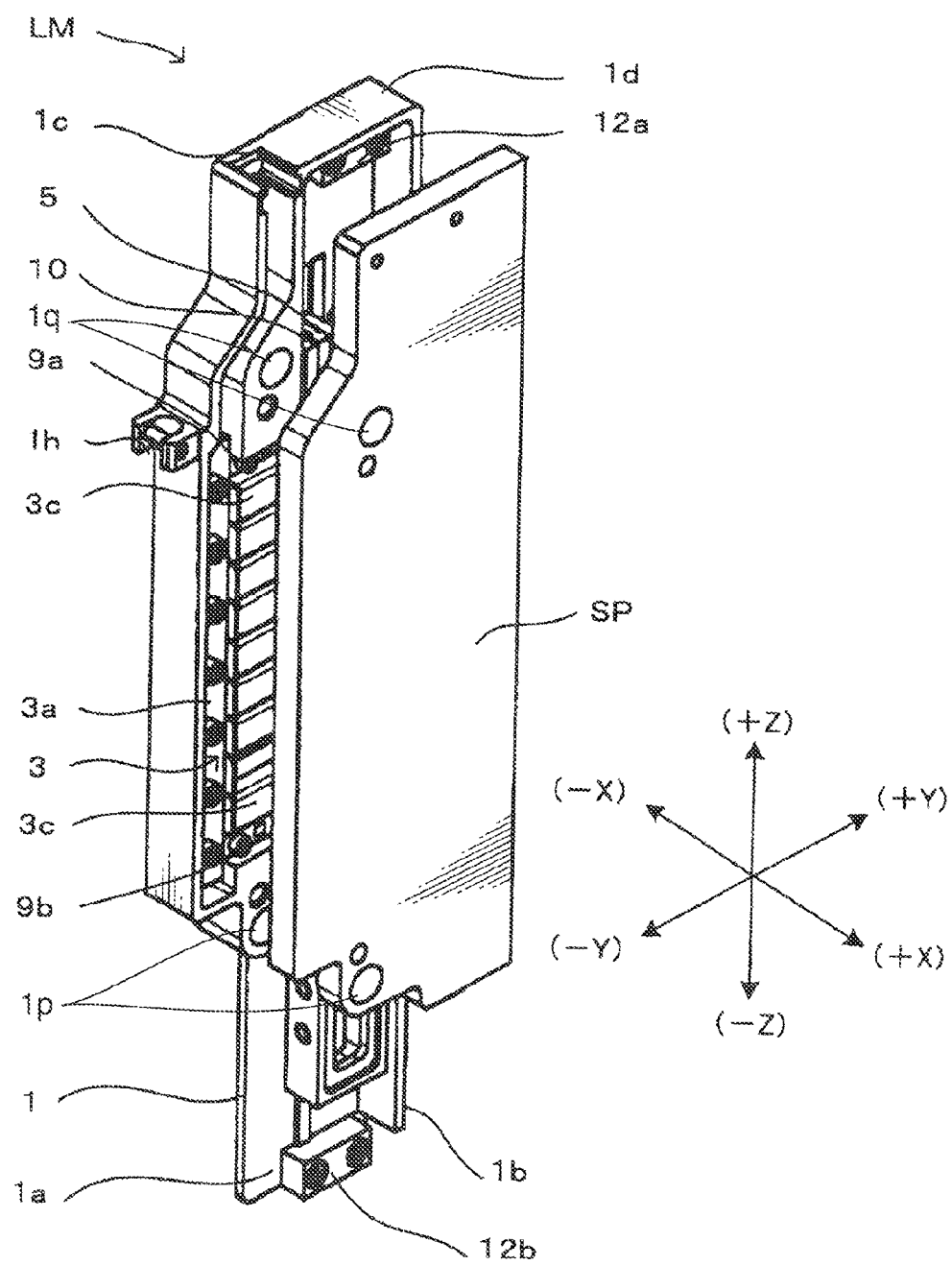
FIG. 14 is an exploded perspective view of a single-shaft linear motor in another mode of implementation of the present invention.

Also, a plurality of single-shaft linear motors each different from the single-shaft linear motor illustrated in FIG. 1, for example, a plurality of single-shaft linear motors illustrated in FIG. 14 in another mode of implementation of the present invention, may be assembled together, or the single-shaft linear motor illustrated in FIG. 1 and the single-shaft linear motor illustrated in FIG. 14 may be assembled in combination.

Referring to FIG. 14, in the single-shaft linear motor illustrated in FIG. 14, three standing walls 1b to 1d each standing in the frontward-rearward direction X are provided as a member integral with or separated from a base plate 1 to partially extend in the moving direction Z along opposite edges of the base plate 1 in the widthwise direction Y. A cover member SP is attached to tops of the standing walls 1b to 1d in spaced-apart and opposed relation to a base surface 1a of the base plate 1, and a space surrounding the standing walls 1b to 1d and the base surface 1a is defined as a containing space. A movable base 4 is provided in the containing space movably in the moving direction Z. An armature (stator) 3 is provided on the base surface 1a of the base plate 1 to extend in the moving direction Z, and a mover (a yoke 5 and a permanent magnet array (not shown)) is provided to extend in the moving direction Z in opposed relation to an array of coils 2c (coil array) of the armature 3.

<Surface Mounter>

Figure 15:
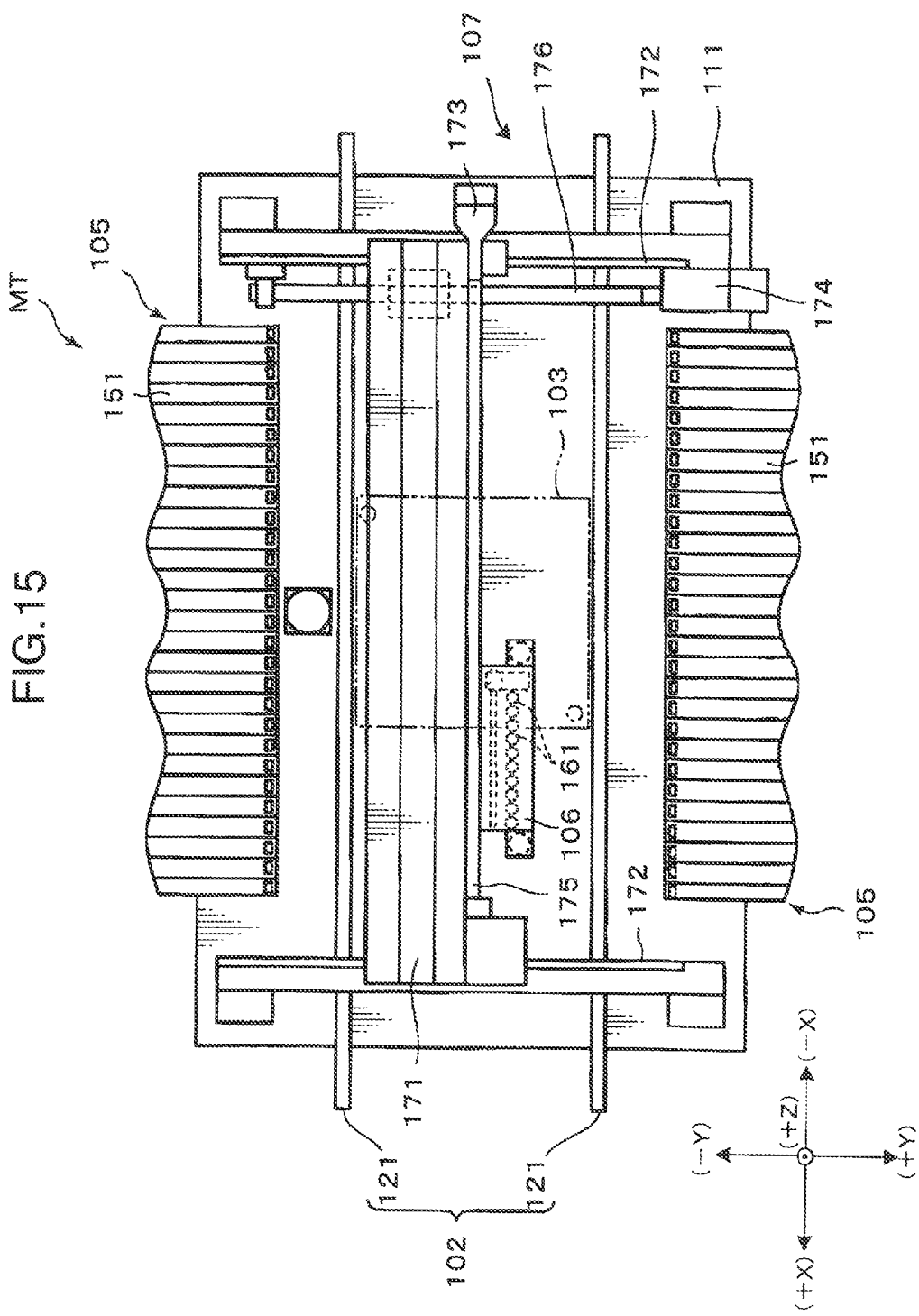
FIG. 15 is a top plan view showing a general structure of a surface mounter in one mode of implementation of a component transfer apparatus of the present invention.
Figure 16:
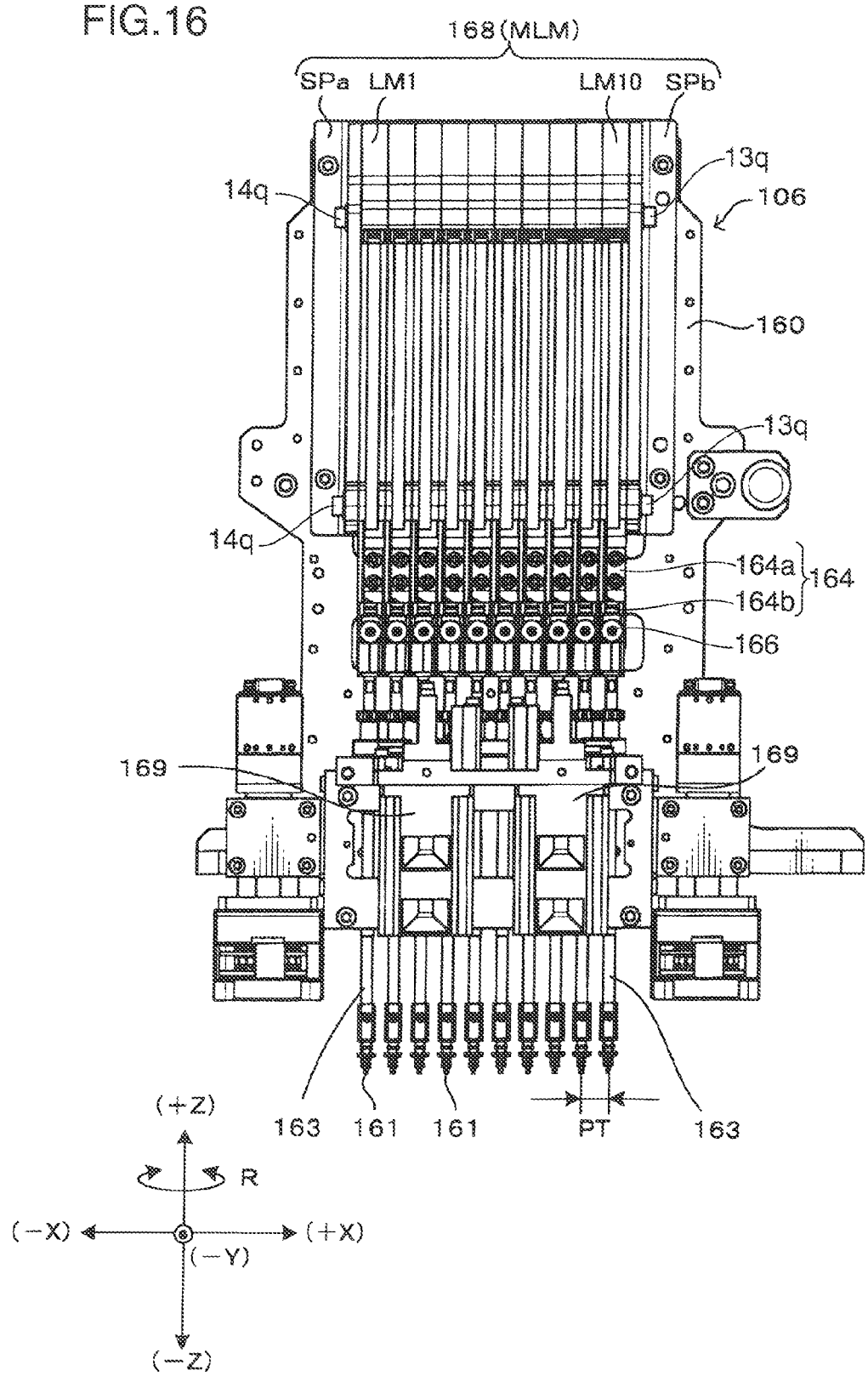
FIG. 16 is a front view of a head unit in the surface mounter illustrated in FIG. 15.
Figure 17:
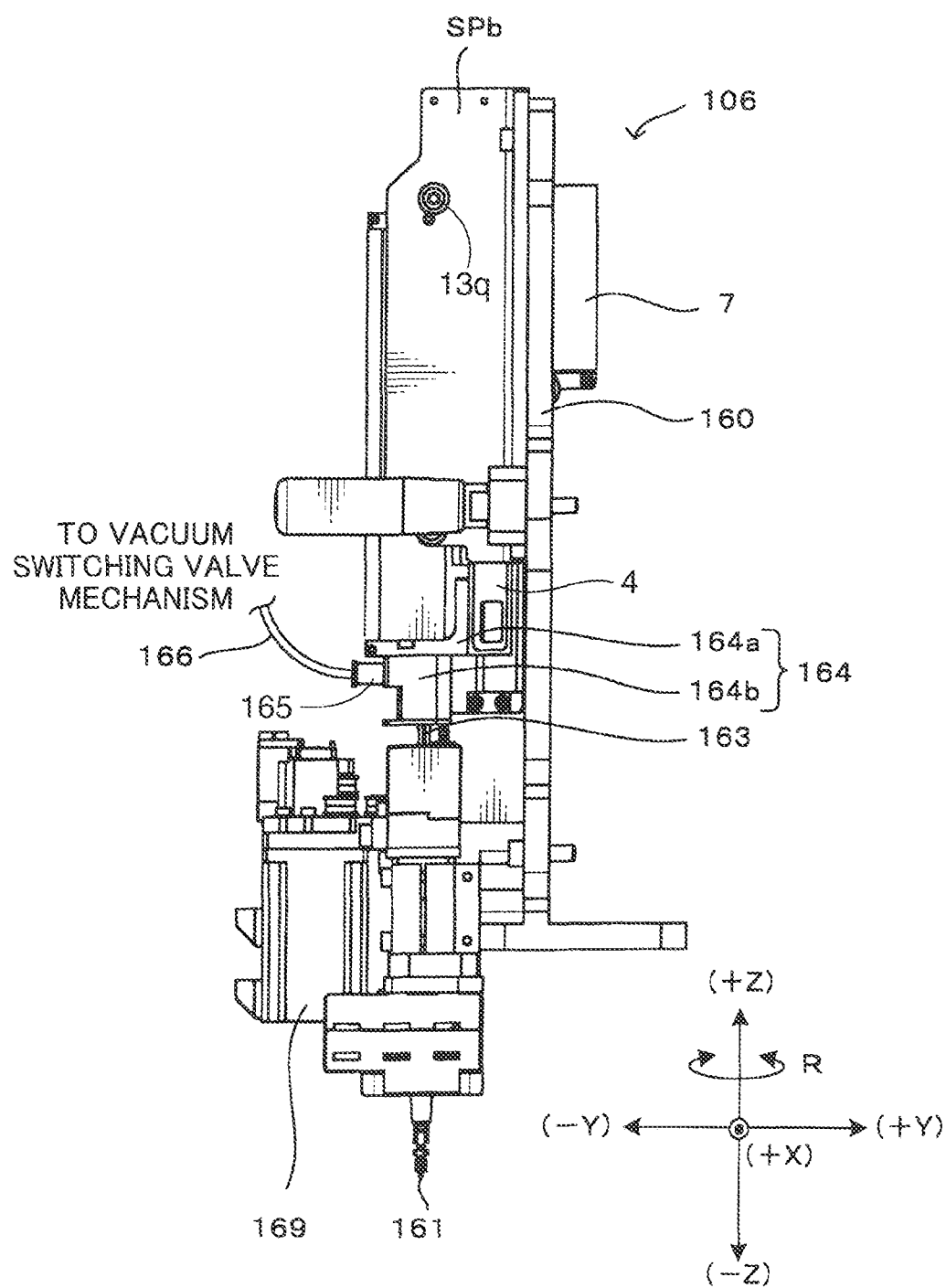
FIG. 17 is a side view of the head unit in the surface mounter illustrated in FIG. 15.
Figure 18:
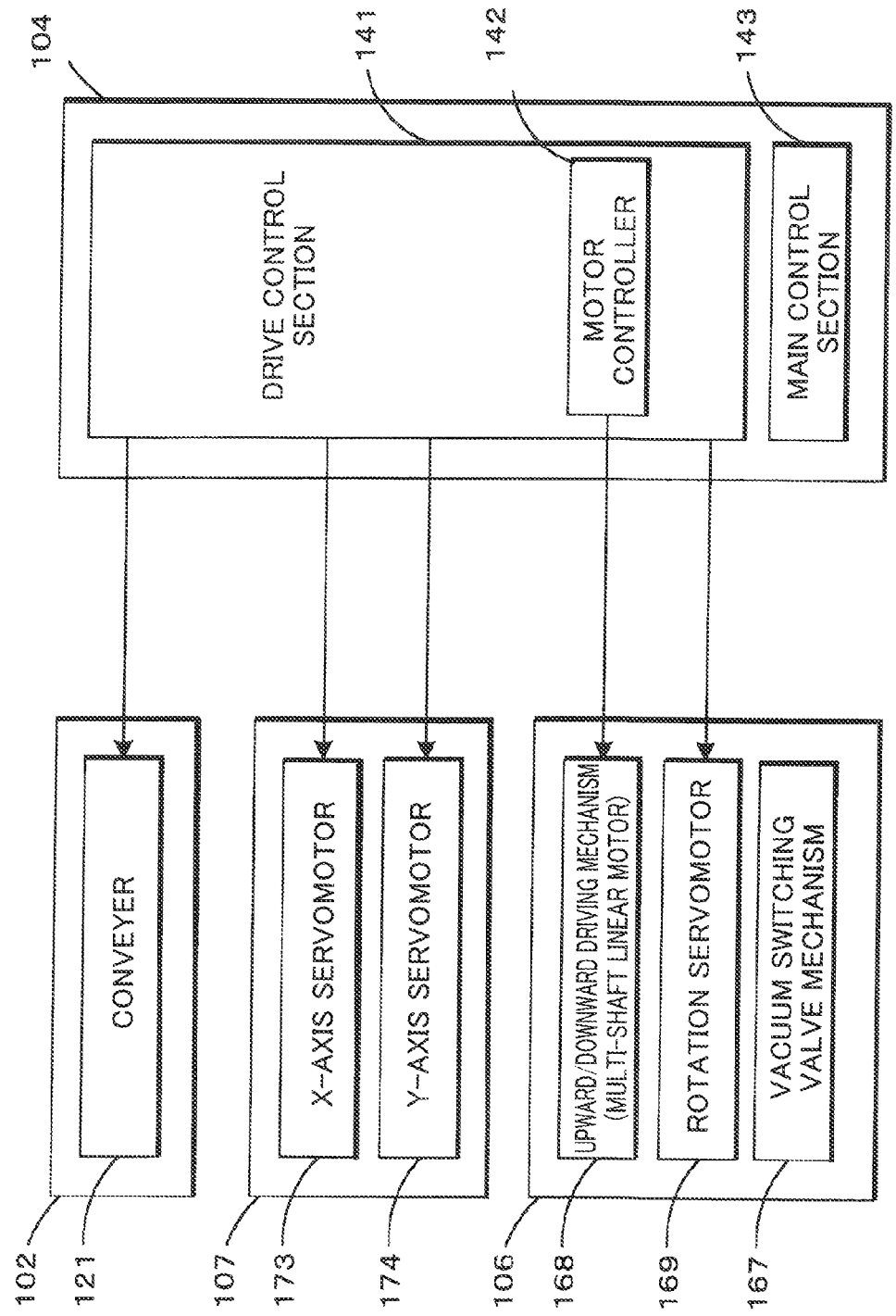
FIG. 18 is a block diagram showing an electrical configuration of the surface mounter illustrated in FIG. 15.

FIG. 15 is a top plan view showing a general structure of a surface mounter which is one example of a component transfer apparatus, according to one embodiment of the present invention. FIGS. 16 and 17 are front and side views of a head unit, respectively. FIG. 18 is a block diagram showing an electrical configuration of the surface mounter illustrated in FIG. 15. In these figures and subsequent illustrative figures, a three-dimensional-XYZ coordinate system is employed in which a vertical direction is defined as the Z-axis. In a state after a multi-shaft linear motor MLM is set up in the surface mounter, the directions X, Y, and Z are aligned with the X-, Y-, and Z-axes, respectively.

In this surface mounter MT, a board carrying mechanism 102 is installed on a base 111 to allow a board 103 to be carried in a given carrying direction. In the illustrated example, the carrying direction is along the X-axis direction. More specifically, the board carrying mechanism 102 comprises a pair of conveyers 121, 121 adapted to carry the board 103 in a direction from a right side to a left side in FIG. 15, on the base 111. These conveyers 121, 121 are controlled by a drive control section 141 of a control unit 104 which is adapted to control the entire surface mounter MT. Specifically, the conveyers 121, 121 are operable, in response to a drive instruction from the drive control section 141, to carry in the board 103 and to stop the carried-in board 103 at a given mounting-operation position (a position of the board 103 indicated by the two-dot chain line in FIG. 15). The board 103 carried in this manner is fixedly held by a holding device whose illustration is omitted. Then, an electronic component (not shown) supplied from a component containing section 105 is transferred to the board 103 by a suction nozzle 161 equipped in a head unit 106. After completion of a mounting operation for all of a plurality of components to be mounted on the board 103, the board carrying mechanism 102 is operable, in response to a drive instruction from the drive control section 141, to carry out the board 103.

The component containing section 105 is disposed on opposite sides of the board carrying mechanism 102. Each of the component containing sections 105 comprises a large number of tape feeders 151. The tape feeder 151 is provided with a reel (not shown) wound with a tape which receives/holds therein a plurality of electronic components, and adapted to supply the electronic components. Specifically, a plurality of small-piece chip electronic components, such as integrated circuits (ICs), transistors, resistors, or capacitors are received and held in each of the tapes at given intervals. When the tape feeder 151 reels the tape out from the reel toward the head unit 106 along the Y-axis direction, the electronic components in the tape are intermittently fed out to allow the suction nozzle 161 of the head unit 106 to perform an operation of picking up the electronic component.

In this embodiment, in addition to the board carrying mechanism 102, a head driving mechanism 107 is provided. The head driving mechanism 107 is designed to move the head unit 106 in the X-axis and Y-axis directions over a given range of the base 111. An electronic component sucked by the suction nozzle 161 is carried from a position just above the component containing section 105 to a position just above the board 103 by the movement of the head unit 106. The head driving mechanism 107 comprises a mounting head-support member 171 extending along the X-axis direction. The mounting head-support member 171 supports the head unit 106 in a movable manner in the X-axis direction. Also, the mounting head-support member 171 is supported by a fixed rail 172 extending in the Y-axis direction, at opposite ends thereof in the X-axis direction, so that it can be moved in the Y-axis direction along the fixed rail 172. The head driving mechanism 107 further comprises an X-axis servomotor 173 serving as a driving source for driving the head unit 106 in the X-axis direction, and a Y-axis servomotor 174 serving as a driving source for driving the head unit 106 in the Y-axis direction. The servomotor 173 is coupled to a ball screw 175, so that, when the servomotor 173 operates in response to an operation instruction from the drive control section 141, the head unit 106 is driven back and force along the X-axis direction through the ball screw 175. The servomotor 174 is coupled to a ball screw 176, so that, when the servomotor 174 operates in response to an operation instruction from the drive control section 141, the mounting head-support member 171 is driven back and force along the Y-axis direction through the ball screw 176.

The head driving mechanism 107 drives the head unit 106 so that it carries the electronic component to the board 103 and transfer the electronic component to a given position while the suction nozzles 161 suck and hold the electronic components (a component transfer operation). More specifically, the head unit 106 is designed as follows. That is, ten mounting heads each extending in the vertical direction Z are arranged in a line at even intervals in the X-axis direction (the carrying direction of the board 103 by the board carrying mechanism 102). The suction nozzle 161 is attached to a distal end of each of the mounting heads. Specifically, as shown in FIGS. 16 and 17, each of the mounting heads comprises a nozzle shaft 163 extending in the Z-axis direction. The shaft nozzle 163 has an air passage formed to extend in an upward direction (+Z side) along an axis thereof. The shaft nozzle 163 has a lower end which communicates through the suction nozzle 161 with the air passage. The suction nozzle 163 also has an upper end which is opened and connected through a coupling unit 164, a connection member 165, an air pipe 166, and a vacuum switching valve mechanism 167 to a vacuum suction source and a positive pressure source.

In the head unit 106, an upward/downward driving mechanism 168 is provided to move the nozzle shaft 163 up and down in the Z-axis direction. A motor controller 142 of the drive control section 141 controls the upward/downward driving mechanism 168 to move the nozzle shaft 163 up and down along the Z-axis direction to move the suction nozzle 161 in the Z-axis direction, thereby setting the suction nozzle 161 at a given position. In this embodiment, a multi-shaft linear motor MLM comprising ten single-shaft linear motors LM1 to LM10 assembled together is used as the upward/downward driving mechanism 168. Details of this structure will be described later.

Also, a rotation servomotor 169 is provided to rotate the suction nozzle 161 around an R direction (two-way) in the X-Y plane (about the Z-axis). The rotation servomotor 169 is operable, based on an operation instruction from the drive control section 141 of the control unit 104, to rotate the suction nozzle 161 in the R direction. Thus, the head unit 106 is moved to the component containing section 105 by the head driving mechanism 107 in the above manner, and then the upward/downward driving mechanism 168 and the rotation servomotor 169 are driven to bring a distal end of the suction nozzle 161 into contact with the electronic component supplied from the component containing section 105, in an adequate posture.

Figure 19:
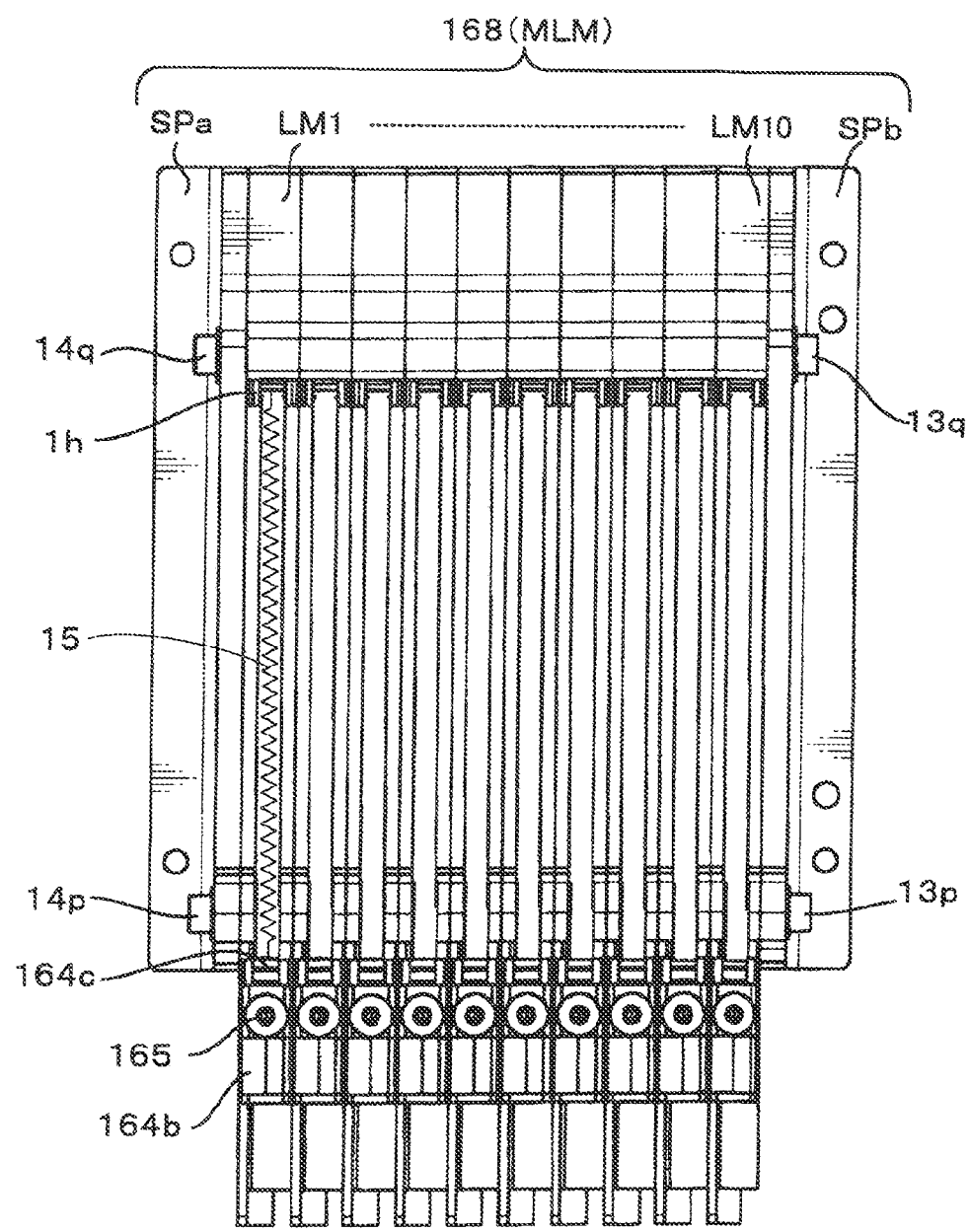
FIG. 19 is a front view showing a structure of an upward/downward driving mechanism in the surface mounter illustrated in FIG. 15.
Figure 20:
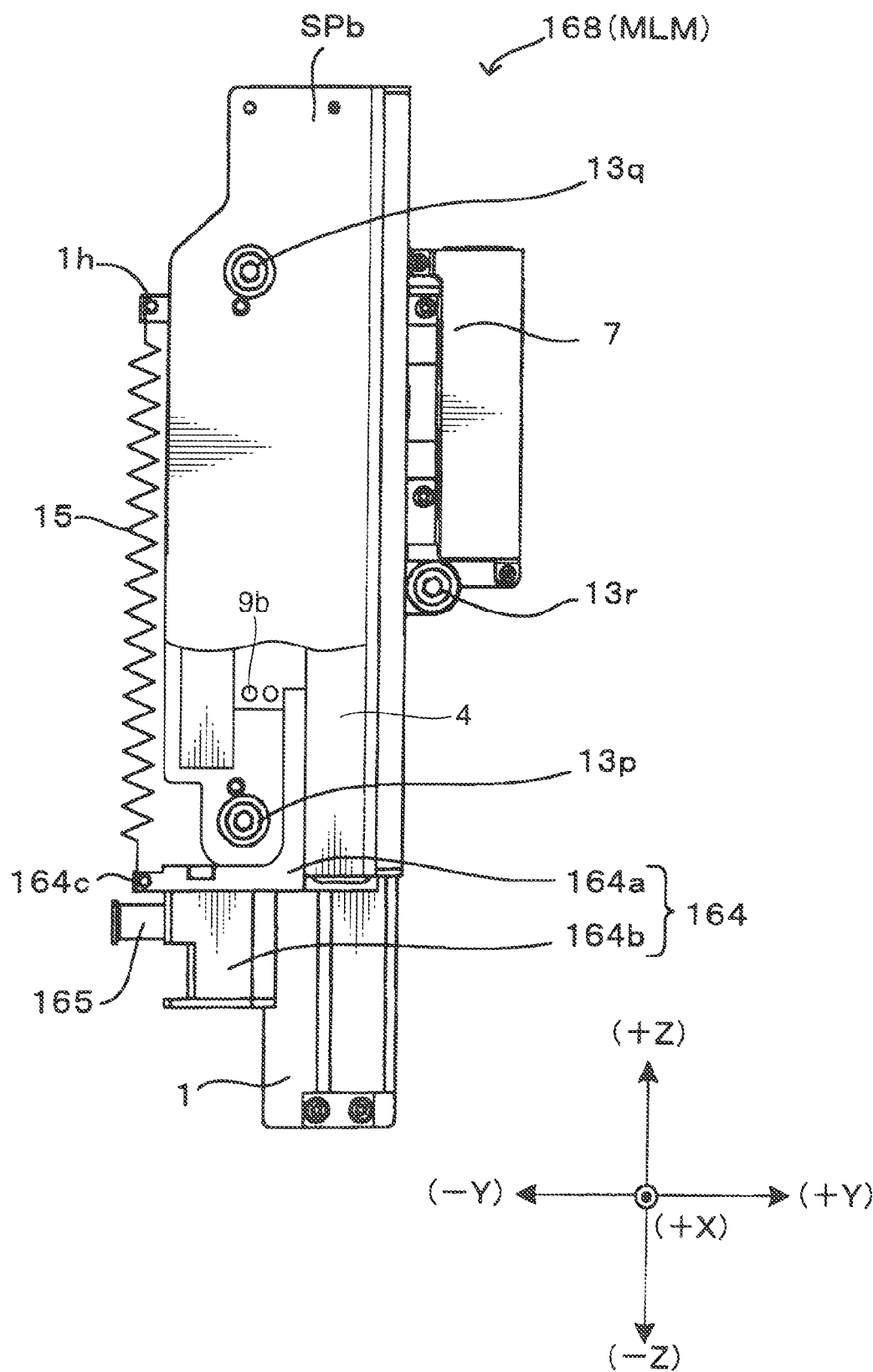
FIG. 20 is a side view showing the structure of the upward/downward driving mechanism in the surface mounter illustrated in FIG. 15.

Referring to FIGS. 19 and 20, the multi-shaft linear motor MLM used as the upward/downward driving mechanism 168 comprises ten single-shaft linear motors LM1 to LM10, and two side plates SPa and SPb. Each of the single-shaft linear motors LM1 to LM10 is the equivalent of the single-shaft linear motor LM described in connection with FIG. 1, and the single-shaft linear motors LM1 to LM10 are arranged by stacking in the X-axis direction in the manner described in connection with FIGS. 10 and 11. The side plate SPb provided on a topmost side (+X side) in a stacking direction also functions as a cover covering a recess portion 1e (see FIG. 5) of the topmost single-shaft linear motor LM10.

The single-shaft linear motors LM1 to LM10 arranged side by side along the X-axis are sandwiched between the two side plates SPa and SPb. Three fastening through-holes are formed in each of the side plates SPa and SPb. The single-shaft linear motors LM1 to LM10 at given positions penetrate the through-holes in the X-axis direction. Three bolts 13p to 13r are inserted into respective ones of the fastening through-holes from the side of the side plate SPb to penetrate therethrough in the X-axis direction, and fastened with respective ones of three nuts 14p to 14q screwed thereon from the side of the side plate Spa. The side plate SPa, the single-shaft linear motors LM1 to LM10, and the side plate SPb are thus integrated together to form the multi-shaft linear motor MLM. The cover member SPa is disposed, and the cover member SPb is disposed on a topmost (+X side) one LM10 of the single-shaft linear motors.

As shown in FIGS. 16 and 17, the multi-shaft linear motor MLM is attached to a base frame 160 of the head unit 106.

As mentioned above, in this embodiment, the ten single-shaft linear motors LM1 to LM10 are stacked. Among them, the single-shaft linear motor LM1 located on the bottommost side (−X side) is equivalent to a "bottommost single-shaft linear motor" in the appended claims, and the side plate SPa located on a rear surface of the bottommost single-shaft linear motor is equivalent to a "bottom-side holding member" in the appended claims. Also, the single-shaft linear motor LM10 located on the topmost side (+X side) is equivalent to a "topmost single-shaft linear motor" in the appended claims, and the side plate SPb located on a front surface of the topmost single-shaft linear motor is equivalent to a "top-side holding member" in the appended claims. Also, the base frame 160 of the head unit 106 is equivalent to a "base member" in the appended claims.

A coupling unit 164 is fixed to each of the movable bases 4 of the multi-shaft linear motor MLM to allow the nozzle shaft 163 to be coupled to a respective one of the movable bases 4.

As shown in FIGS. 16 and 17, the coupling unit 164 comprises an L-shaped block member 164a fixed to an end of the movable base 4 on the forward side (−Z side) in the moving direction Z, and a shaft holder 164b fixed to the block member 164a. In this embodiment, each of the members 164a and 164b is one example of a coupling member for coupling the nozzle shaft 163 as a driven object and the movable base 4 as a main component of the movable section.

The block member 164a has integrally a vertical portion extending upwardly along the Z-axis direction, and a horizontal portion extending from a lower end of the vertical portion (the forward side (−Z side) in the moving direction Z) toward the one edge side (−Y side) in the widthwise direction Y. The vertical portion of the block member 164a is fixed to the movable base 4 by a screw. The shaft holder 164b is attached to a lower surface (−Z side) of the horizontal portion of the block member 164a. Thus, the nozzle shaft 163 is integrally coupled to the movable base 4 of a corresponding one of the single-shaft linear motors LM1 to LM10 through the coupling unit 164, in an upwardly and downwardly movable manner along the Z-axis direction.

In this embodiment, the multi-shaft linear motor MLM is used as the upward/downward driving mechanism 168, and the moving direction Z of each of the movable bases 4 is set to be parallel to a vertical direction. Therefore, each of the movable bases 4 is constantly biased toward the forward side (−Z side) by gravity. For this reason, in each of the single-shaft linear motors LM1 to LM10, an upper end of a return spring 15 is engaged with a spring engagement portion 1h of the base plate 1, and a lower end of the return spring 15 is engaged with a spring engagement portion 164c provided on the horizontal portion of the block member 164a. The movable base 4 is thus biased toward the backward side (+Z side), i.e., upwardly, by the return spring 15. Therefore, during stop of a current supply to the coils 3c of each of the single-shaft linear motors LM1 to LM10, the movable base 4 is received inside the base plate 1. Consequently, each of the suction nozzles 161 is located at an upper position. This prevents each of the suction nozzles 161 or the electronic component sucked by the suction nozzle 161 from causing an accident of interference with the board 103, the conveyer 121 or the like, even if, for example, the X-axis servomotor 173 or the Y-axis servomotor 174 is activated under a condition that the upward/downward driving mechanism 168 is nonfunctional due to stop of a current supply.

As shown in FIG. 17, the connection member 165 is attached to a front surface (the −Y side in the widthwise direction Y) of the shaft holder 164b. One end of the air pipe 166 is connected to the connection member 165, to allow the air sent from the vacuum switching valve mechanism 167 through the air pipe 166 to be sent to the shaft holder 164b, or reversely allow the air from the shaft holder 164b to be sucked toward the vacuum switching valve mechanism 167 through the air pipe 166. As mentioned above, the vacuum switching valve mechanism 167 and each of the suction nozzles 161 are connected to each other by the following path: the air pipe 166—an air path (not shown) inside the shaft holder 164b—the nozzle shaft 163, to allow a positive pressure to be supplied to the suction nozzle 161, or to allow a negative pressure to be supplied to the suction nozzle 161.

In the surface mounter having the above structure, exserting a program pre-stored in a memory (whose illustration is omitted) of the control unit 104, a main control section 143 of the control unit 104 operates to control each section of the surface mounter to move the head unit 106 between a position just above the component containing section 105 and a position just above the board 103 in a reciprocating manner. Also, under a condition that the head unit 106 is stopped at the position just above the component containing section 105, the upward/downward driving mechanism 168 and the rotation servomotor 169 are drive-controlled to bring the distal end of the suction nozzle 161 into contact with the electronic component supplied from the component containing section 105, in an adequate posture, and provide a negative-pressure suction force to the suction nozzle 161 to allow the electronic component to be held by the suction nozzle 161. Then, suction-holding the electronic component, the head unit 106 moves to the position just above the board 103 and transfers the electronic component to a given position. In this manner, the component transfer operation of transferring the electronic component from the component containing section 105 to a component mounting region of the board 103 is repeatedly performed.

As mentioned above, the surface mounter according to this embodiment is adapted to drive the nozzle shaft 163 up and down in the Z-axis direction using the multi-shaft linear motor MLM. The multi-shaft linear motor MLM comprises the ten single-shaft linear motors LM1 to LM10, each of which has the same structure as that of the single-shaft linear motor LM illustrated in FIG. 1. Because the ten single-shaft linear motors LM1 to LM10 are arranged by stacking in the frontward-rearward direction X (i.e., in a direction perpendicular to the base surface 1a), the following functions/effects can be obtained. The plurality of movable bases 4 can be arranged in the stacking direction (frontward-rearward direction X) with excellent relative positional accuracy, so that the nozzle shafts coupled to the respective movable bases 4 can also be arranged in the stacking direction (frontward-rearward direction X) with excellent relative positional accuracy. Then, each of the single-shaft linear motors LM1 to LM10 can be driven independently to accurately position each of the suction nozzles 161 in the upward-downward direction Z.

Figure 21:
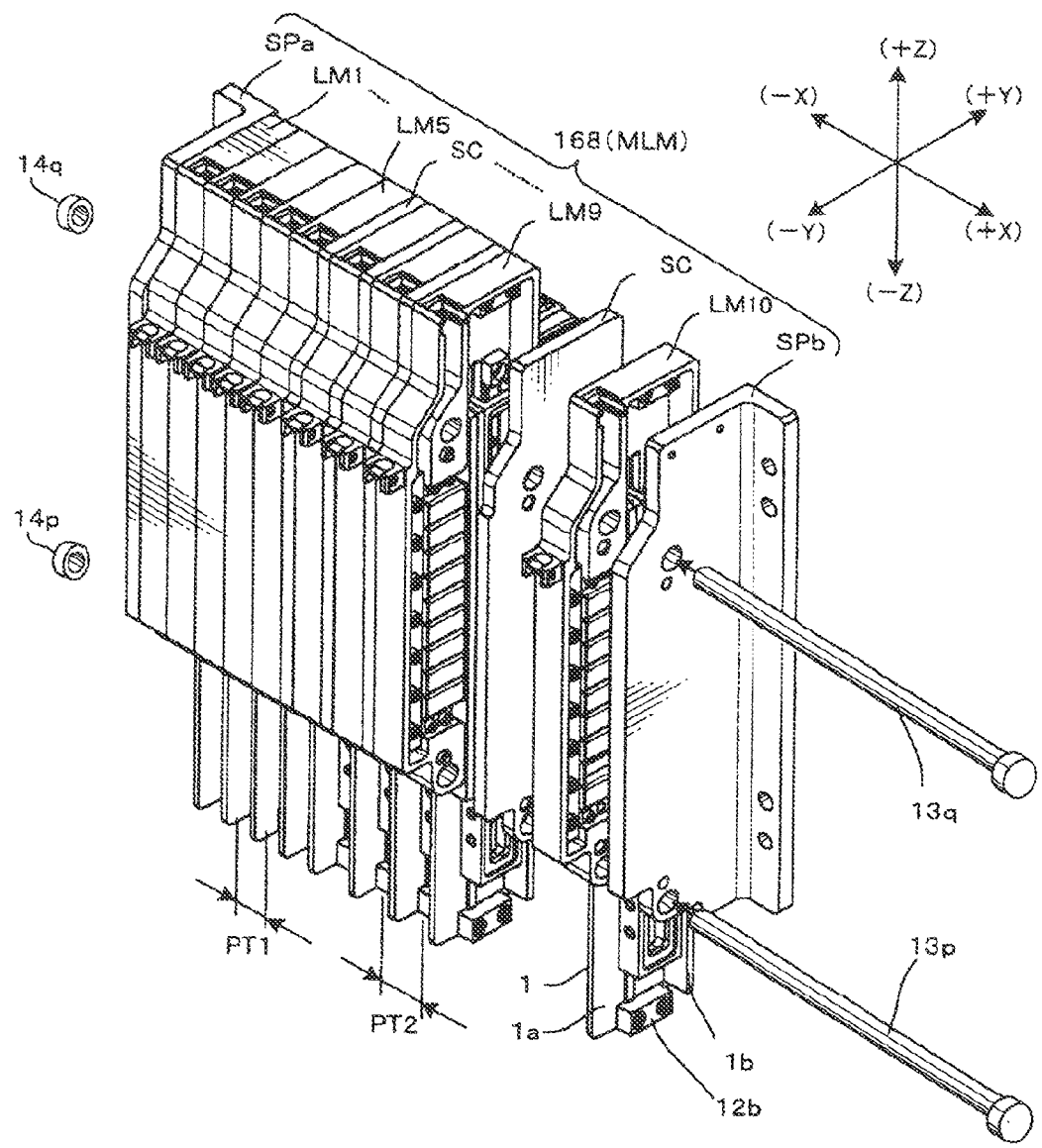
FIG. 21 is a perspective view showing a pre-assembled state of a multi-shaft linear motor in according to yet another embodiment of the present invention.

In the multi-shaft linear motor MLM having the above structure, the pitch PT between the movable bases 4 in the stacking direction is shortened, so that a pitch PT, between the nozzle shafts coupled to the respective movable bases 4 in the stacking direction, can be shortened to allow the suction nozzles 161 to hold components at a pitch PT narrower than ever before, e.g., 12 mm pitch, in the stacking direction. In cases where it is necessary to change the pitch PT in the stacking direction, a depth dimension of the single-shaft linear motor constituting the multi-shaft linear motor MLM may be changed. Alternatively, as shown in FIG. 21, a pitch adjustment plate SC may be inserted into a boundary position where two of the single-shaft linear motors LM5 to LM10 are located adjacent to each other, to adjust pitches PT1, PT2, - - - , between adjacent ones of the single-shaft linear motors LM5 to LM10 in the stacking direction. In this case, a pitch PT1 between adjacent ones of the linear motors LM1 to LM5 and a pitch PT2 between adjacent ones of the linear motors LM5 to LM10 can be set to become different from each other. This makes it possible to adjust the pitch in the stacking direction flexibly and with a high degree of accuracy without changing the structure of each of the single-shaft linear motors LM5 to LM10.

In the upward/downward driving mechanism 168 (multi-shaft linear motor MLM) in this embodiment, the side plate SPa is disposed on the side of the rear surface (−X side) of the bottommost single-shaft linear motor LM1, and the side plate SPb is disposed on the side of the front surface (+X side) of the topmost single-shaft linear motor LM10. In fact, the ten single-shaft linear motors LM1 to LM10 are sandwiched between the side plates SPa and SPb which integrally hold the motors. In addition, the side plates SPa and SPb of the upward/downward driving mechanism 168 (multi-shaft linear motor MLM) formed in this manner are detachably attached to the base frame 160 of the head unit 106. Thus, as compared with an operation of attaching the ten single-shaft linear motors LM1 to LM10 to the base frame 160 individually, an attaching operation can be facilitated. In addition, an operation of detaching the upward/downward driving mechanism 168 from the base frame 160 of the head unit 106 to perform a maintenance operation, such as inspection or repair of the upward/downward driving mechanism 168 can also be facilitated. This provides improved maintenance serviceability of the upward/downward driving mechanism.

<Other Modifications>

In the above embodiment, the multi-shaft linear motor MLM formed by stacking a plurality of the single-shaft linear motors LM illustrated in FIG. 1 is used as the upward/downward driving mechanism 168. Alternatively, a multi-shaft linear motor formed by stacking a plurality of single-shaft linear motors different from the single-shaft linear motors LM illustrated in FIG. 1, for example a plurality of the single-shaft linear motors LM illustrated in FIG. 14, or a combination of a plurality of types of single-shaft linear motors each having a different structure, may also be used.

In the above embodiment, the present invention is applied to a surface mounter MT functioning as a component transfer apparatus. However, an apparatus suited to use the present invention is not limited thereto, but the present invention may be applied to any other suitable type of component transfer apparatus, such as an IC handler.

As described above, according to one aspect of the present invention, there is provided a multi-shaft linear motor which comprises a plurality of single-shaft linear motors each provided with a magnetic body and an armature and adapted to produce a force causing the magnetic body and the armature to be relatively displaced along a given linear moving direction by interaction of magnetic fluxes generated between the magnetic body and the armature during an operation of supplying electric power to the armature. In the multi-shaft linear motor, each of the single-shaft linear motors includes a stator formed as one of the magnetic body and the armature, a mover formed as the other of the magnetic body and the armature and adapted to be movable relative to the stator, and a base plate having a base surface defining the moving direction. The stator is fixed onto the base surface along the moving direction. The mover is attached onto the base surface in a movable manner reciprocating along the moving direction and in opposed relation to the stator. The single-shaft linear motors are stacked in a stacking direction perpendicular to the base surface in such a way that the single-shaft linear motors are individually detachable as a unit, the base plate thereof contains the stator and the mover.

In a preferred embodiment, each of the single-shaft linear motors includes a movable section attached to the base plate in a relatively movable manner reciprocating along the moving direction with respect to the base plate. The movable section supports the mover in such a manner that the mover is disposed opposed to the stator in a widthwise direction perpendicular to the moving direction and the stacking direction. In this embodiment, the mover and the stator are disposed side by side in the widthwise direction, so that a thickness of each of the single-shaft linear motors can be suppressed in the stacking direction for stacking the single-shaft linear motors, i.e., a direction perpendicular to the base surface. Thus, in the multi-shaft linear motor formed by stacking the plurality of single-shaft linear motors each having the above structure, a pitch between the movable sections in the stacking direction (direction perpendicular to the base surface) can be reduced.

In a preferred embodiment, the mover is attached to a lateral surface of one end of the mover in the widthwise direction. In this embodiment, the mover of each of the single-shaft linear motors is arranged in parallel with the lateral surface of one end of the movable section in the widthwise direction, and the stator is disposed opposed to the mover at a position offset outward from the movable section. This makes it possible to further reduce the pitch between the movable sections in the stacking direction (direction perpendicular to the base surface) in the multi-shaft linear motor.

In a preferred embodiment, each of the single-shaft linear motors includes a standing wall provided on an outer peripheral edge of the base plate at a position at least along the moving direction, for defining, in cooperation with the base surface, a containing space opened to allow the stator, the mover, and the movable section to be selectively inserted thereinto and pulled out thereof in a direction perpendicular to the base surface. The containing space of a bottom-side one of the single-shaft linear motors, located on a bottom side thereof in the stacking direction, is covered by a rear surface of the base plate of a top-side one of the single-shaft linear motors located on the side of a top of the bottom-side single-shaft linear motor in adjacent relation. In this embodiment, the containing space surrounded by the standing wall and the base surface is formed to be opened in the direction perpendicular to the base surface. The opening has a broadening in the moving direction and the widthwise direction. Therefore, a person or operator can easily access the containing space through the opening with a relatively short stroke relative to the base surface. Thus, each of the movable section, the mover and the stator can be assembled and disassembled by an insertion/pull-out operation with a relatively short stroke relative to the base surface, which makes it possible to facilitate positioning of the stator and the mover during assembling to provide enhanced assembling accuracy. Also, in the same manner as that during assembly, during inspection/repair of the movable section or the like, an operator can readily access the containing space to perform a maintenance operation.

In a preferred embodiment, each of the single-shaft linear motors includes a standing wall provided on an outer peripheral edge of the base plate at a position at least along the moving direction, for defining, in cooperation with the base surface, a containing space opened to allow the stator, the mover, and the movable section to be selectively inserted thereinto and pulled out thereof in a direction perpendicular to the base surface, and a cover member attached to a top of the standing wall to close the opening in such a manner as to cover the containing space as well as the movable section, the stator, and the mover each received in the containing space. In this embodiment, the base plate of the top-side single-shaft linear motor also functions as a cover member for the bottom-side single-shaft linear motor to effectively prevent foreign substances from getting inside. Also, a structure is employed in which the base plates are directly stacked each other, so that a thickness of each of the single-shaft linear motors in the stacking direction (direction perpendicular to the base surface) can be suppressed. This makes it possible to further reduce the pitch between the movable sections in the stacking direction. Also, the rigidity of the base plate can be improved by forming the standing wall, and the strength can be increased by installing all of the movable section, the stator and the mover in the containing space. This makes it possible to increase the strength of the multi-shaft linear motor itself.

In a preferred embodiment, the multi-shaft linear motor comprises a bottom-side holding member disposed on a bottommost one of the plurality of single-shaft linear motors located on a bottommost side thereof in the stacking direction, and a top-side holding member disposed on a topmost one of the single-shaft linear motors located on a topmost side thereof in the stacking direction, wherein the plurality of single-shaft linear motors are sandwiched between the bottom-side and the top-side holding members holding the single-shaft linear motors. In this embodiment, a relative positional relationship between the single-shaft linear motors can be stably maintained.

In a preferred embodiment, the multi-shaft linear motor comprises a fastener member which penetrates through the base plates of the single-shaft linear motors, the bottom-side holding member, and the top-side holding member, along the stacking direction to fasten the single-shaft linear motors together. In this embodiment, the single-shaft linear motors are firmly integrated together by the fastener member, so that a relative positional relationship between the movable sections can be further stably maintained.

In a preferred embodiment, the multi-shaft linear motor comprises a pitch adjustment plate interposed between adjacent ones of the single-shaft linear motors to increase a pitch between the adjacent single-shaft linear motors by a given thickness in the stacking direction. In this embodiment, a distance between the single-shaft linear motors in the stacking direction is adjusted by the interposition of the pitch adjustment plate, which makes it possible to adjust a pitch between the movable sections in the stacking direction easily and with a high degree of accuracy.

In a preferred embodiment, the multi-shaft linear motor comprises top-side and bottom-side engagement sections respectively formed in paired relation on top-side and bottom-side of a stacking surface between adjacent ones of the single-shaft linear motors stacked on top each other, one of the engagement sections sticks out to fit into the other engagement section dented in the stacking direction, thereby, when the single-shaft linear motors are stacked, positioning the single-shaft linear motors adjacent to each other. In this embodiment, the top-side and bottom-side engagement sections are engaged with each other in the boundaries where the single-shaft linear motors constituting the multi-shaft linear motor are located adjacent to each other in the stacking direction, thereby positioning the single-shaft linear motors when the single-shaft linear motors are stacked on top each other. This makes it possible to allow the plurality of moving sections to be driven individually and independently while being arranged in the stacking direction with excellent relative positional accuracy.

According to another aspect of the present invention, there is provided a component transfer apparatus for transferring a component from a component containing section to a component mounting area. The component transfer apparatus comprises: a head unit including a base member, a plurality of nozzle shafts each supported movably relative to the base member in an upward-downward direction and adapted to provide a negative pressure, supplied through a negative-pressure pipe connected to a backward end thereof, to a suction nozzle attached to a forward end thereof, and an upward/downward driving mechanism adapted to drive each of the plurality of nozzle shafts in the upward-downward direction independently; and head driving means adapted to move the head unit between a position just above the component containing section and a position just above the component mounting area. The upward/downward driving mechanism is the above multi-shaft linear motor. The multi-shaft linear motor is attached to the base member in such a manner that the moving direction becomes parallel to the upward-downward direction. The plurality of single-shaft linear motors constituting the multi-shaft linear motor are associated with the plurality of nozzle shafts in a one-to-one correspondence. The movable section of each of the single-shaft linear motors is coupled to a corresponding one of the nozzle shafts.

The above component transfer apparatus uses the multi-shaft linear motor according to the present invention as the upward/downward driving mechanism, so that the plurality of moving sections can be arranged in the stacking direction with excellent relative positional accuracy, and thereby the nozzle shafts coupled to the respective movable sections can also be arranged with excellent relative positional accuracy. Then, each of the single-shaft linear motors can be driven independently to accurately position each of the nozzle shafts and the suction nozzles in the upward-downward direction.

According to yet another aspect of the present invention, there is provided a component transfer apparatus for transferring a component from a component containing section to a component mounting area. The component transfer apparatus comprises: a head unit including a base member, a plurality of nozzle shafts each supported movably relative to the base member in an upward-downward direction and adapted to provide a negative pressure, supplied through a negative-pressure pipe connected to a backward end thereof, to a suction nozzle attached to a forward end thereof, and an upward/downward driving mechanism adapted to drive each of the plurality of nozzle shafts in the upward-downward direction independently; and head driving means adapted to move the head unit between a position just above the component containing section and a position just above the component mounting area. The upward/downward driving mechanism is the multi-shaft linear motor having the bottom-side and top-side holding members. The multi-shaft linear motor is detachably attached to the base member through the bottom-side holding member and the top-side holding member, in such a manner that the moving direction becomes parallel to the upward-downward direction. The plurality of single-shaft linear motors constituting the multi-shaft linear motor are associated with the plurality of nozzle shafts in a one-to-one correspondence while being sandwiched between and integrally held by the bottom-side holding member and the top-side holding member. The movable section of each of the single-shaft linear motors is coupled to a corresponding one of the nozzle shafts.

In this aspect, an attachment of the upward/downward driving mechanism to the base member is facilitated. Also, a detachment of the upward/downward driving mechanism from the base member to perform a maintenance operation, such as inspection or repair of the upward/downward driving mechanism is also facilitated. Thus, maintenance serviceability of the upward/downward driving mechanism can be improved by employing the above structure.

The invention claimed is:

1. A multi-shaft linear motor comprising
a plurality of single-shaft linear motors,
  each of the plurality of single-shaft linear motors includes:
  a base plate having a base surface;
  a movable member disposed movably in a given moving direction with respect to the base surface of the base plate;
  a stator extending along the moving direction, the stator disposed on the base plate;
  a mover attached to the movable member along the moving direction, such that the mover is distanced from the stator while facing to the stator with respect to a widthwise direction perpendicular to the moving direction and to a normal direction of the base surface;
  standing walls each standing toward a frontward side of the base surface along two edges of the base plate on respective opposite sides in the widthwise direction, the standing walls and the base surface make up a containing space with an opening at the frontward side of the base surface, wherein the movable member, the stator, and the mover are accommodated in the containing space;
  a detector unit having a sensor and a linear scale, the detector unit being configured to detect a position of the movable member; and
  an assembly including a sensor control unit and the sensor, the assembly being fixed to the base plate in such a manner that the sensor control unit is disposed on a side opposite to the linear scale with respect to the widthwise direction so that the sensor faces the linear scale to detect the position of the movable member, wherein the assembly is adapted to be detachable from to the containing space through a cutout formed in one of the standing walls,
wherein
each of the plurality of single-shaft linear motors is configured to drive the movable member in the moving direction by interaction of a magnetic flux generated between the movable member and the stator,
each of the plurality of single-shaft linear motors is stacked along the normal direction of the base surface, and
a top of the standing wall of a bottom-side single-shaft linear motor located on a bottom-side in a stacking direction is fixed on an opposing surface of a base plate of a top-side single-shaft linear motor adjacent to top-side of the bottom-side single-shaft linear motor, so that the containing space of the bottom-side single-shaft linear motor is covered by the opposing surface of the base plate of the top-side single-shaft linear motor.

2. The multi-shaft linear motor in accordance with claim 1, wherein the mover of each of the plurality of single-shaft linear motors is attached to a one side with respect to the widthwise direction of a lateral surface of an end of the movable member.

3. The multi-shaft linear motor in accordance with claim 1, further comprising:
   a bottom-side holding member disposed on a bottommost one of the plurality of single-shaft linear motors located on a bottommost side with respect to the stacking direction; and
   a top-side holding member disposed on a top-most one of the plurality of single-shaft linear motors located on a topmost side with respect to the stacking direction,
   wherein the plurality of single-shaft linear motors are sandwiched between the bottom-side holding member and the top-side holding member.

4. The multi-shaft linear motor in accordance with claim 3, wherein
   the base plate of the plurality of single-shaft linear motors, the bottom-side holding member, and the top-side holding member are respectively formed with a through-hole,
   the bottom-side holding member and the top-side holding member are stacked such that each through-hole is arranged in a row along a direction of the normal line, and
   a fastener member penetrates respective through-holes to fasten the single-shaft linear motors together.

5. The multi-shaft linear motor in accordance with claim 1, wherein
   a pitch adjustment plate having a thickness with respect to the stacking direction is interposed at a boundary position between the single-shaft linear motors located adjacent to each other in the stacking direction, so that a pitch between two single-shaft linear motors located adjacent to each other in the stacking direction is extended by the thickness of the pitch adjustment plate.

6. The multi-shaft linear motor in accordance with claim 1, further comprising the plurality of single-linear motors each configured to linearly drive the movable member along the given moving direction,
   wherein
       each of the plurality of single-linear motors is stacked in the stacking direction perpendicular to the moving direction,
       a bottom-side engagement section disposed on a bottom-side single-shaft linear motor located at bottom-side of the stacking direction with respect to a boundary position between the single-shaft linear motors located adjacent to each other in the stacking direction, a top-side engagement section is disposed, the top-side engagement section being engageable to the bottom-side engagement section of a top-side single-shaft linear motor located top-side in the stacking direction,
       adjacent single-shaft linear motors are positioned to each other by engagement of each of the bottom-side engagement section and the top-side engagement section at respective boundary portions.

* * * * *